(12) United States Patent
Umehara

(10) Patent No.: US 11,214,864 B2
(45) Date of Patent: *Jan. 4, 2022

(54) METHOD FOR REDUCING METAL CONTAMINATION AND FILM DEPOSITION APPARATUS

(71) Applicant: Tokyo Electron Limited, Tokyo (JP)

(72) Inventor: Takahito Umehara, Iwate (JP)

(73) Assignee: Tokyo Electron Limited, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/935,580

(22) Filed: Mar. 26, 2018

(65) Prior Publication Data

US 2018/0282862 A1 Oct. 4, 2018

(30) Foreign Application Priority Data

Mar. 29, 2017 (JP) .............................. JP2017-064368

(51) Int. Cl.
*C23C 16/02* (2006.01)
*C23C 16/44* (2006.01)
(Continued)

(52) U.S. Cl.
CPC ...... *C23C 16/4404* (2013.01); *C23C 16/0209* (2013.01); *C23C 16/0227* (2013.01);
(Continued)

(58) Field of Classification Search
CPC ............ C23C 16/0209; C23C 16/0227; C23C 16/0236; C23C 16/0245;
(Continued)

(56) References Cited

U.S. PATENT DOCUMENTS 5,658,391 A * 8/1997 Buley ................. C23C 16/4405
134/1.1
5,824,375 A * 10/1998 Gupta ................... B08B 7/0035
427/569

(Continued)

FOREIGN PATENT DOCUMENTS

CN 103430286 A * 12/2013 ........... H01L 21/205
JP 2010-192757 9/2010

(Continued)

OTHER PUBLICATIONS

Webster's Ninth New Collegiate Dictionary; Merriam-Webster Inc., Publishers; Springfield, Massachusetts, USA; 1990 (no month) excerpt p. 342.*

(Continued)

*Primary Examiner* — Bret P Chen
(74) *Attorney, Agent, or Firm* — IPUSA, PLLC

(57) ABSTRACT

A method for reducing metal contamination performed after dry cleaning of a process chamber used for a film deposition process and before starting the film deposition process is provided. In the method, a temperature in the process chamber is changed from a first temperature during the dry cleaning to a film deposition temperature. Hydrogen and oxygen are activated in the vacuum chamber while supplying hydrogen and oxygen into the process chamber. An inside of the process chamber is coated by performing the film deposition process without a substrate in the process chamber after the step of activating hydrogen and oxygen.

5 Claims, 14 Drawing Sheets

(51) Int. Cl.
*C23C 16/40* (2006.01)
*C23C 16/455* (2006.01)
*H01L 21/67* (2006.01)
*H01L 21/687* (2006.01)

(52) U.S. Cl.
CPC ............ *C23C 16/40* (2013.01); *C23C 16/401* (2013.01); *C23C 16/4405* (2013.01); *C23C 16/45551* (2013.01); *H01L 21/67028* (2013.01); *H01L 21/68764* (2013.01); *H01L 21/68771* (2013.01)

(58) Field of Classification Search
CPC .......... C23C 16/40–409; C23C 16/401; C23C 16/402; C23C 16/4404; C23C 16/4405; C23C 16/4408; C23C 16/4554; C23C 16/45551; H01J 2237/335
USPC .......... 427/534, 535, 539; 438/905; 134/1.1, 134/1.2, 1.3
See application file for complete search history.

(56) References Cited

U.S. PATENT DOCUMENTS

| | | | |
|---|---|---|---|
| 6,071,573 A * | 6/2000 | Koemtzopoulos | C23C 16/4404 427/237 |
| 6,164,295 A * | 12/2000 | Ui | B08B 7/0035 134/1.1 |
| 6,624,064 B1 | 9/2003 | Sahin et al. | |
| 6,846,742 B2 | 1/2005 | Rossman | |
| 7,981,809 B2 | 7/2011 | Shibata et al. | |
| 7,989,365 B2 | 8/2011 | Park et al. | |
| 8,080,109 B2 * | 12/2011 | Okada | B08B 5/00 134/1.1 |
| 8,231,732 B2 * | 7/2012 | Nakagawa | H01L 21/67069 134/1 |
| 8,518,488 B2 * | 8/2013 | Furusawa | C23C 16/24 427/248.1 |
| 9,824,884 B1 * | 11/2017 | Sims | H01L 21/02211 |
| 10,053,773 B2 * | 8/2018 | Kishi | H01J 37/3053 |
| 10,290,476 B2 * | 5/2019 | Hirayama | C23C 16/44 |
| 10,403,814 B2 * | 9/2019 | Kubo | H01L 21/67109 |
| 10,668,512 B2 * | 6/2020 | Sato | H01L 21/02164 |
| 10,773,282 B2 * | 9/2020 | Coppa | H01J 37/32697 |
| 2003/0203113 A1 * | 10/2003 | Cho | C30B 29/18 427/255.23 |
| 2003/0205237 A1 * | 11/2003 | Sakuma | C23C 16/4405 134/1.1 |
| 2004/0166598 A1 * | 8/2004 | Miya | G01N 21/73 438/9 |
| 2005/0191827 A1 | 9/2005 | Collins et al. | |
| 2006/0090694 A1 * | 5/2006 | Cho | C23C 16/45531 117/104 |
| 2006/0162861 A1 * | 7/2006 | O'Meara | C03C 17/001 156/345.24 |
| 2006/0202281 A1 * | 9/2006 | Aisawa | H01L 24/02 257/374 |
| 2007/0004220 A1 | 1/2007 | Tran Quoc et al. | |
| 2007/0204797 A1 | 9/2007 | Fischer | |
| 2008/0000423 A1 | 1/2008 | Fukiage | |
| 2008/0282976 A1 * | 11/2008 | Okada | B08B 5/00 118/696 |
| 2009/0061092 A1 | 3/2009 | Kameshima et al. | |
| 2010/0047954 A1 * | 2/2010 | Su | C03B 33/0222 438/61 |
| 2010/0210094 A1 * | 8/2010 | Furusawa | C23C 16/24 438/493 |
| 2012/0015525 A1 * | 1/2012 | Endo | H01L 21/67109 438/758 |
| 2012/0068246 A1 * | 3/2012 | Tanaka | H01L 29/518 257/316 |
| 2013/0017685 A1 * | 1/2013 | Akae | H01L 21/0228 438/703 |
| 2015/0147482 A1 * | 5/2015 | Kang | C23C 16/45525 427/535 |
| 2015/0267292 A1 * | 9/2015 | Kim | C23C 16/4405 427/255.28 |
| 2017/0282223 A1 * | 10/2017 | Coppa | H01L 21/67069 |
| 2017/0323768 A1 * | 11/2017 | Zhang | H01J 37/32082 |

FOREIGN PATENT DOCUMENTS

| | | | | |
|---|---|---|---|---|
| JP | 2013-214584 | | 10/2013 | |
| JP | 2014-017322 | | 1/2014 | |
| KR | 2003-0018422 | * | 3/2002 | ............ H01L 21/02 |
| KR | 10-2010-0094951 | | 8/2010 | |
| KR | 10-1139078 | | 4/2012 | |
| KR | 10-2044763 B1 | * | 11/2019 | ............ H01L 21/02 |

OTHER PUBLICATIONS

Shin, Byungha, et al., "Pre-atomic layer deposition surface cleaning and chemical passivation of (100) In0.2Ga0.8AsIn0.2Ga0.8As and deposition of ultrathin Al2O3Al2O3 gate insulators". Appl. Phys. Lett. 93, 052911 (2008), pp. 1-4, https://doi.org/10.1063/1.2966357.*

Hiller, D., et al., "Low temperature silicon dioxide by thermal atomic layer deposition: Investigation of material properties". Journal of Applied Physics 107, 064314 (2010) pp. 1-10. https://doi.org/10.1063/1.3327430.*

Cigal, J., et al., "On-site fluorine chamber cleaning for semiconductor thin-film processes: Shorter cycle times, lower greenhouse gas emissions, and lower power requirements," 2016 27th Annual SEMI Advanced Semiconductor Manufacturing Conference (ASMC), Saratoga Springs, NY, USA, 2016, pp. 201-205.*

Timm, Rainer, et al., "Self-cleaning and surface chemical reactions during hafnium dioxide atomic layer deposition on indium arsenide". Nature Communications (2018) 9:1412, pp. 1-9. DOI: 10.1038/s41467-018-03855-z.*

Ogawa, Hiroki, et al., "Dry Cleaning Technology for Removal of Silicon Native Oxide Employing Hot NH3 /NF3 Exposure". Jpn. J. Appl. Phys. vol. 41 (2002) pp. 5349-5358.*

Shoeb, Juline, et al., "Damage by radicals and photons during plasma cleaning of porous low-k SiOCH. I. Ar/O2 and He/H2 plasmas". J. Vac. Sci. Technol. A 30(4), Jul./Aug. 2012, 041303, pp. 1-15.*

Korner, N., et al., "Hydrogen plasma chemical cleaning of metallic substrates and silicon wafers". Surface and Coatings Technology 76-77 (1995) 731-737.*

Zhou, Baosuo, et al., "Effect of surface temperature on plasma-surface interactions in an inductively coupled modified gaseous electronics conference reactor". J. Vac. Sci. Technol. A 23(6), Nov./Dec. 2005, pp. 1657-1667.*

International Search Report for PCT/JP2015/077031 dated Dec. 8, 2015.

* cited by examiner

FIG.11

| BASIC REACTION | CHAIN REACTION | RECOMBINATION | $HO_2$ REACTION |
|---|---|---|---|
| $H_2+O_2=HO_2+H$ | $H+O_2=OH+O$<br>$O+H_2=OH+H$<br>$OH+H_2=H_2O+H$ | $H+H+M=H_2+M$<br>$O+O+M=O_2+M$<br>$H+OH+M=H_2O+M$<br>$O+H_2+M=HO_2+M$<br>$OH+OH+M=H_2O_2+M$ | $HO_2+HO_2=H_2O_2+O_2$<br>$H+HO_2=OH+OH, H_2+O_2$<br>$O+HO_2=OH+O_2$<br>$OH+HO_2=H_2O+O_2$<br>$H+H_2O_2=H_2+HO_2,$<br>$OH+H_2O$<br>$O+H_2O_2=OH+HO_2$ |

METHOD FOR REDUCING METAL CONTAMINATION AND FILM DEPOSITION APPARATUS

CROSS-REFERENCE TO RELATED APPLICATION

The present application is based upon and claims priority of Japanese Patent Application No. 2017-064368, filed on Mar. 29, 2017, the entire contents of which are incorporated herein by reference.

BACKGROUND OF THE INVENTION

1. Field of the Invention

The present invention relates to a method for reducing metal contamination and a film deposition apparatus.

2. Description of the Related Art

Japanese Laid-Open Patent Application Publication No. 2014-17322 discloses a method for cleaning a film deposition apparatus that includes a first process gas supply part and a second process gas supply part that are provided apart from each other in a rotational direction of a turntable and are provided to supply a first process gas and a second process gas to the turntable, respectively. The film deposition apparatus further includes a first vacuum exhaust opening and a second vacuum opening to evacuate the first process gas and the second process gas, respectively, and a cleaning gas supply part to supply a cleaning gas. In the method, evacuation from the first vacuum exhaust opening is stopped, and the cleaning gas is supplied while evacuation from the second vacuum exhaust opening is performed.

The cleaning method disclosed in Japanese Laid-Open Patent Application Publication No. 2014-17322 can reduce a defect of evacuating the cleaning gas too much from the second vacuum exhaust opening and thereby reducing an amount of the cleaning gas that contacts the turntable.

However, a fluorine-based cleaning gas such as $ClF_3$ that exerts an etching action is frequently used to clean a film deposition apparatus. Such cleaning using the fluorine-based gas sometimes not only removes a film on the turntable but also damages the turntable and metal parts in a process chamber, which generates metal contamination. Such metal contamination may cause a metal component that becomes impurities by mixing into a deposited film, thereby degrading quality of the film.

SUMMARY OF THE INVENTION

The present disclosure provides a method for reducing metal contamination and a film deposition apparatus that can reduce metal contamination caused by cleaning of the film deposition apparatus.

According to one embodiment of the present disclosure, there is a method for reducing metal contamination performed after dry cleaning of a process chamber used for a film deposition process and before starting the film deposition process is provided. In the method, a temperature in the process chamber is changed from a first temperature during the dry cleaning to a film deposition temperature. Hydrogen and oxygen are activated in the vacuum chamber while supplying hydrogen and oxygen into the process chamber. An inside of the process chamber is coated by performing the film deposition process without a substrate in the process chamber after the step of activating hydrogen and oxygen.

BRIEF DESCRIPTION OF THE DRAWINGS

FIG. 11 is a diagram illustrating a combustion reaction of hydrogen;

DETAILED DESCRIPTION OF THE PREFERRED EMBODIMENTS

The embodiments of the present disclosure are described below with reference to the accompanying drawings.

Figure 1:
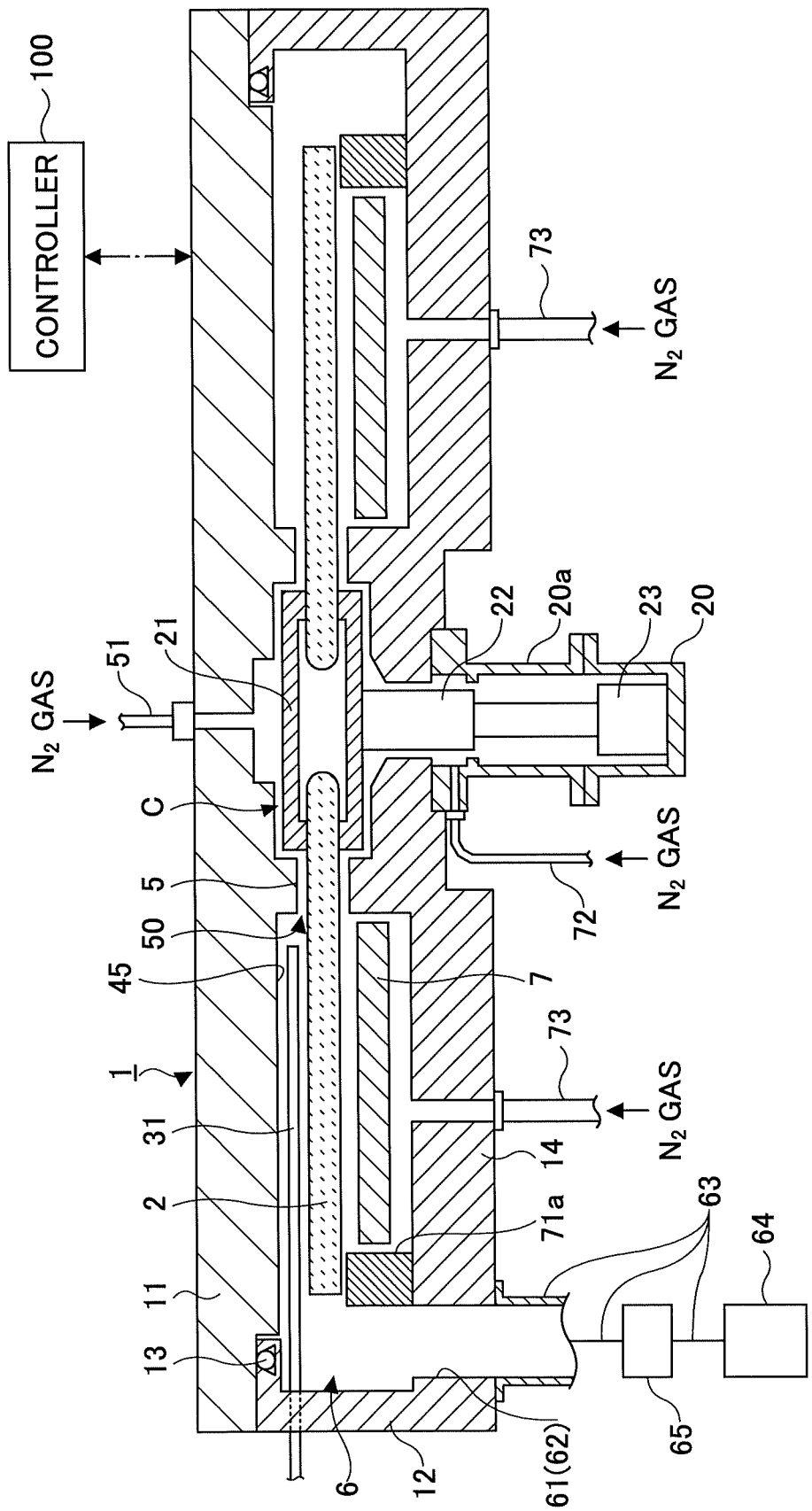
FIG. 1 is a cross-sectional view of a film deposition apparatus according to an embodiment of the present disclosure.
Figure 2:
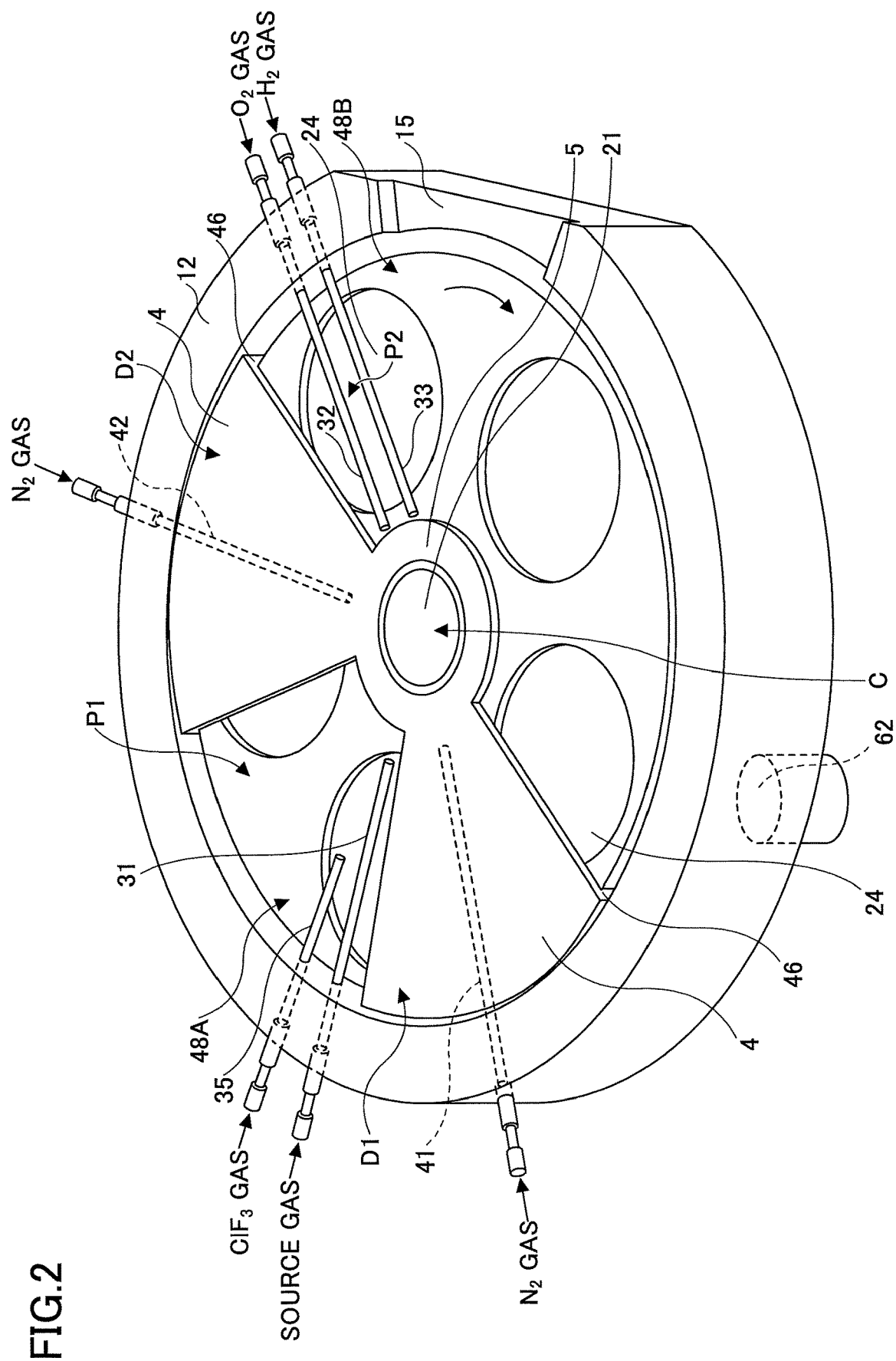
FIG. 2 is a perspective view of the film deposition apparatus of FIG. 1, schematically illustrating its internal configuration, according to the embodiment of the present disclosure.

As illustrated in FIG. 1 (a cross-sectional view taken along line A-A of FIG. 3) and FIG. 2, a film deposition apparatus according to an embodiment of the present disclosure includes a flat vacuum chamber 1 having a substantially circular planar shape and a turntable 2 provided inside the vacuum chamber 1 to have a rotation center at the center of the vacuum chamber 1. The vacuum chamber 1 includes a chamber body 12 and a ceiling plate 11 separable from the chamber body 12. The ceiling plate 11 is attached to the chamber body 12 via a sealing member 13 such as an O ring, thereby hermetically sealing the vacuum chamber 1. The ceiling plate 11 and the chamber body 12 may be formed of, for example, aluminum (Al). Moreover, the turntable 2 may be formed of, for example, quartz.

Referring to FIG. 1, the turntable 2 has a circular opening at the center, and is held from above and below by a cylindrical core part 21 around the opening. The core part 21 is fixed to the upper end of a vertically extending rotary shaft 22. The rotary shaft 22 passes through a bottom part 14 of the chamber body 12 to have its lower end attached to a drive part 23 that causes the rotary shaft 22 to rotate on a vertical axis. This configuration allows the turntable 2 to rotate with its center axis serving as a rotation center. The rotary shaft 22 and the drive part 23 are housed in a tubular case body 20 that is open at its upper end. This case body 20 is hermetically attached to the lower surface of the bottom part 14 of the chamber body 12 via a flange part 20a provided at its upper end, thereby separating the internal atmosphere of the case body 20 from the external atmosphere.

Figure 3:
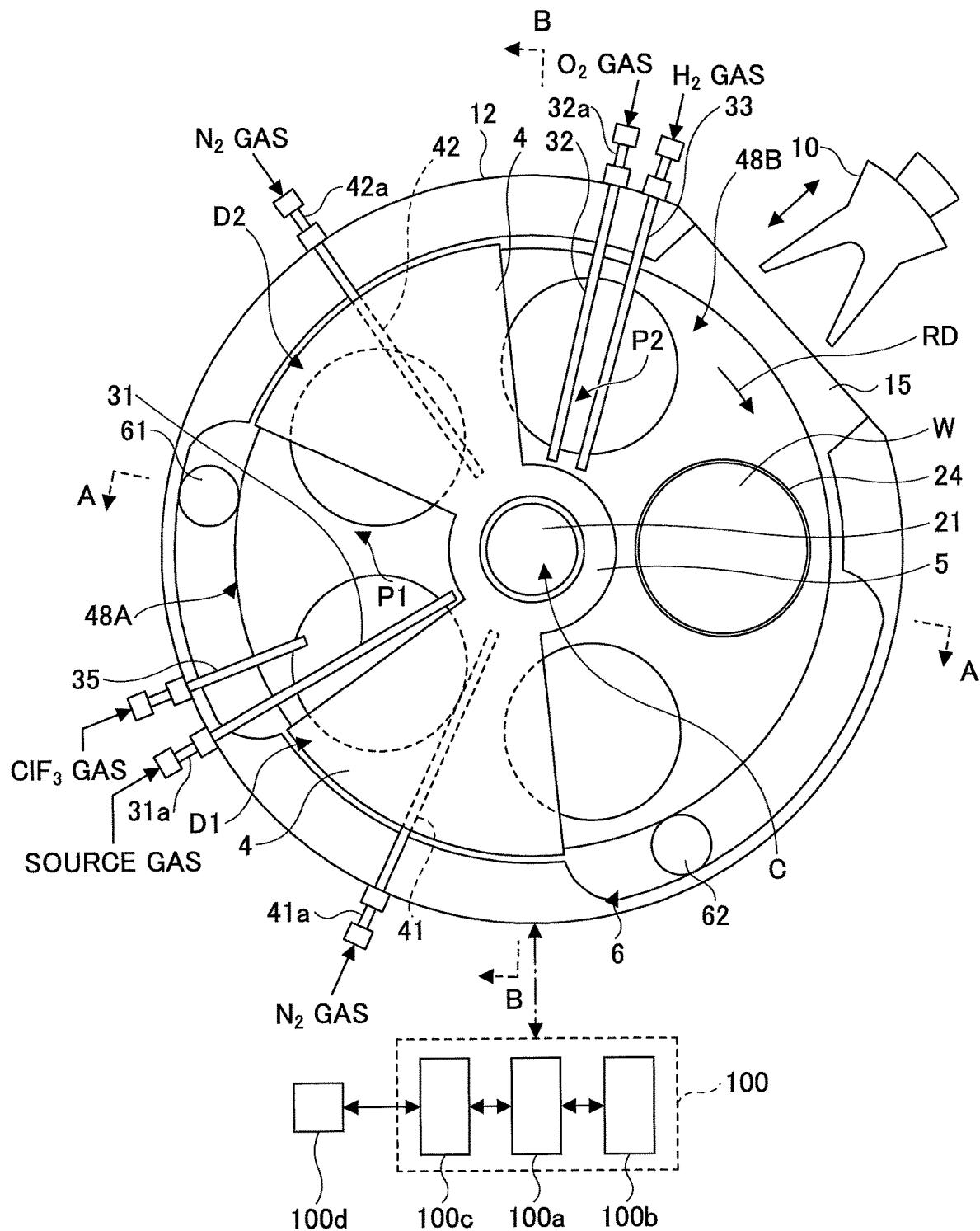
FIG. 3 is a plan view of the film deposition apparatus of FIG. 1 according to the embodiment of the present disclosure.

As illustrated in FIG. 2 and FIG. 3, multiple (five, in the illustrated example) circularly depressed placement parts 24 for placing respective wafers W are formed in a surface (upper surface) of the turntable 2 at equal angular intervals. In FIG. 3, only one of the wafers W is illustrated.

Figure 4A:
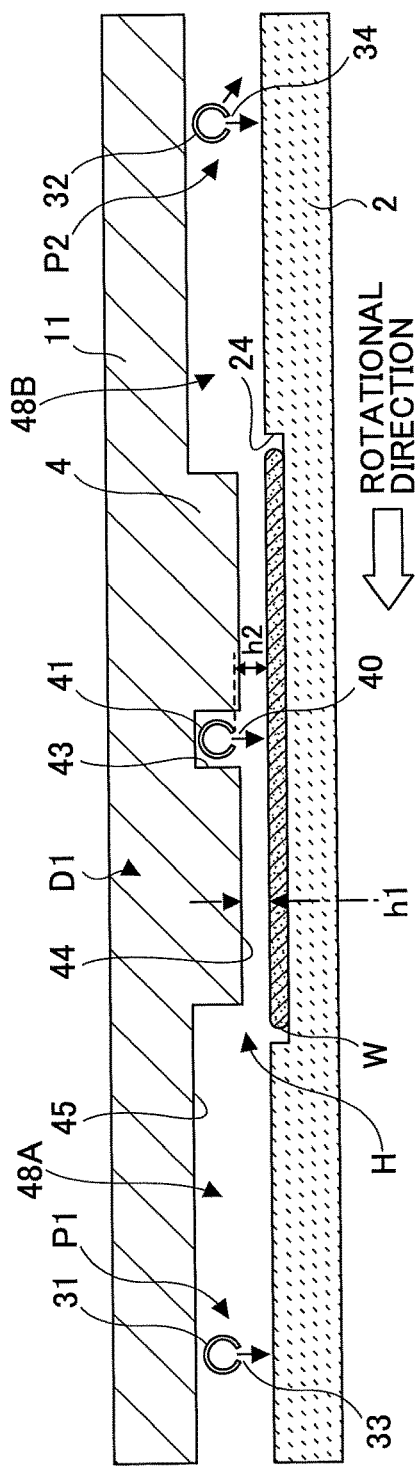
FIGS. 4A and 4B are cross-sectional views of the film deposition apparatus of FIG. 1, illustrating a supply region and a separation region, according to the embodiment of the present disclosure.

Referring to FIG. 4A, the cross sections of the placement part 24 and the wafer W placed in the placement part 24 are shown. As illustrated in FIG. 4A, the placement part 24 is slightly (for example, 4 mm) larger in diameter than the wafer W, and has a depth substantially equal to the thickness of the wafer W. Since the depth of the placement part 24 is substantially equal to the thickness of the wafer W, the surface of the wafer W is substantially flush with the surface of the region of the turntable 2 except for the placement parts 24 when the wafer W is placed in the placement part 24. If there is a relatively large difference in height between the wafer W and the region, the difference in height causes turbulence in a gas flow, thereby affecting the uniformity of film thickness on the wafer W. In order to reduce this effect, the two surfaces are at substantially the same height. For "substantially the same height," which may include cases where the difference in height is less than or equal to approximately 5 mm, the difference in height is preferably as close to zero as possible to the extent permitted by processing accuracy.

Figure 4B:
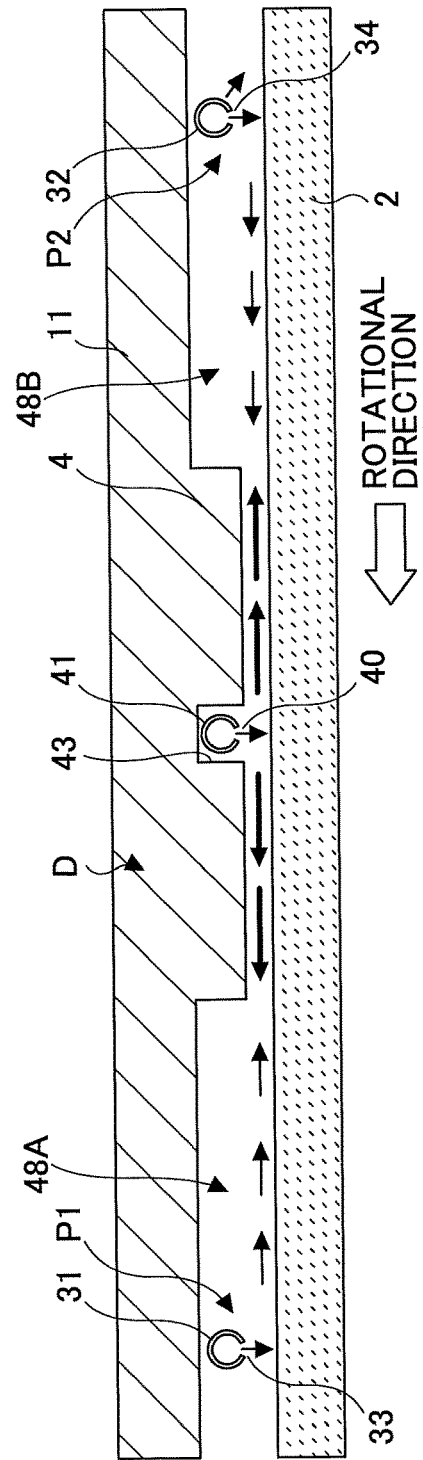

Referring to FIG. 2 through FIG. 4B, two convex portions 4 apart from each other are provided along the rotation direction of the turntable 2 (for example, indicated by arrow RD of FIG. 3). Although the ceiling plate 11 is omitted in FIG. 2 and FIG. 3, the convex portions 4 are attached to a lower surface 45 (FIG. 4A) of the ceiling plate 11 as illustrated in FIGS. 4A and 4B. Further, as is seen from FIG. 3, the upper surface of each of the convex portions 4 has a substantially sectorial shape, whose vertex is positioned substantially at the center of the vacuum chamber 1 and whose arc is positioned along the inner circumferential wall surface of the chamber body 12. Further, as illustrated in FIG. 4A, the convex portions 4 are disposed so that lower surfaces 44 thereof are positioned at height h1 from the turntable 2.

Referring to FIG. 3 and FIGS. 4A and 4B, the convex portions 4 include respective groove parts 43 that extend radially to bisect the respective convex portions 4. The groove parts 43 house respective separation gas nozzles 41 and 42. In this embodiment, the groove parts 43 are formed so as to bisect the convex portions 4. In other embodiments, however, the groove parts 43 may be formed so that the divided convex portions 4 have wider portions on the upstream side in the rotation direction of the turntable 2. As illustrated in FIG. 3, the separation gas nozzles 41 and 42 are introduced into the vacuum chamber 1 through the circumferential wall of the chamber body 12, and are supported by having respective gas introduction ports 41a and 42a, which are their base end parts, attached to the peripheral wall surface of the chamber body 12.

The separation gas nozzles 41 and 42 are connected to a gas supply source of a separation gas (not illustrated). The separation gas may be nitrogen ($N_2$) gas or an inert gas. The separation gas is not limited to a particular kind as long as the separation gas does not affect film deposition. In this embodiment, $N_2$ gas is used as a separation gas. Further, the separation gas nozzles 41 and 42 have discharge holes 40 (FIGS. 4A and 4B) for discharging $N_2$ gas toward the upper surface of the turntable 2. The discharge holes 40 are disposed lengthwise at predetermined intervals. In this embodiment, the discharge holes 40 have an aperture of approximately 0.5 mm, and are arranged at intervals of approximately 10 mm along the lengthwise directions of the separation gas nozzles 41 and 42.

According to the above-described configuration, a separation region D1 that defines a separation space H (FIG. 4A) is provided by the separation gas nozzle 41 and the corresponding convex portion 4. Likewise, a separation region D2 that defines a corresponding separation space H is provided by the separation gas nozzle 42 and the corresponding convex portion 4. Further, on the downstream side of the separation region D1 in the rotation direction of the turntable 2, a first region 48A (a first supply region) is formed that is substantially surrounded by the separation regions D1 and D2, the turntable 2, the lower surface 45 of the ceiling plate 11 (hereinafter, "ceiling surface 45"), and the inner circumferential wall surface of the chamber body 12. Further, on the upstream side of the separation region D1 in the rotation direction of the turntable 2, a second region 48B (a second supply region) is formed that is substantially surrounded by the separation regions D1 and D2, the turntable 2, the ceiling surface 45, and the inner circumferential wall surface of the chamber body 12. When $N_2$ gas is discharged from the separation gas nozzles 41 and 42 in the separation regions D1 and D2, respectively, the pressure becomes higher in the separation spaces H than in the first region 48A and the second region 48B, so that $N_2$ gas flows from the separation spaces H to the first region 48A and the second region 48B. In other words, the convex portions 4 in the separation regions D1 and D2 guide $N_2$ gas from the separation gas nozzles 41 and 42 to the first region 48A and the second region 48B.

Further, referring to FIG. 2 and FIG. 3, a source gas nozzle 31 is introduced in a radial direction of the turntable 2 through the circumferential wall part of the chamber body 12 in the first region 48A, and an oxygen gas nozzle 32 and a hydrogen gas nozzle 33 are introduced in a radial direction of the turntable 2 through the circumferential wall of the chamber body 12 in the second region 48B. Like the separation gas nozzles 41 and 42, the source gas nozzles 31, the oxygen gas nozzle 32 and the hydrogen gas nozzle 33 are supported by having respective gas introduction ports 31a, 32a and 33a, which are their base end parts, attached to the peripheral wall surface of the chamber body 12.

Further, the source gas nozzles 31, the hydrogen gas nozzle 32 and the hydrogen gas nozzle 33 have multiple discharge holes 34 for discharging reaction gases toward the upper surface (a surface where there are the wafer placement parts 24) of the turntable 2 (See FIGS. 4A and 4B). In this embodiment, the discharge holes 34 have an aperture of approximately 0.5 mm, and are arranged at intervals of approximately 10 mm along the lengthwise directions of the reaction gas nozzles 31 and 32.

Although not illustrated in the drawings, the source gas nozzle 31 is connected to a source gas supply source (not illustrated in the drawings), and the oxygen gas nozzle 32 is connected to an oxygen gas supply source (not illustrated in the drawings). Although a variety of gases may be used as the source gas, a silicon-containing gas is used as the source gas in the present embodiment. More specifically, an example of using tris(dimethylamino)silane (3DMAS) is described below. Further, in the following description, the region below the source gas nozzle 31 may be referred to as a first process region P1 to cause 3DMAS to adsorb on the wafers W, and the region below the reaction gas nozzle 32 may be referred to as a second process region P2 to cause $O_2$ gas to react with (oxidize) 3DMAS adsorbed on the wafers W. The hydrogen gas nozzle 33 is used not only to perform the method for reducing the metal contamination according to the present embodiment but also to deposit a film. During the film deposition process, 3DMAS is oxidized by supplying oxygen from the oxygen gas nozzle 32 and supplying hydrogen from the hydrogen gas nozzle 33.

Moreover, the first region 48A includes a cleaning gas nozzle 35. Although the cleaning gas nozzle 35 is not used during the film deposition process, when the film deposition processes are repeated until an oxide film is deposited on the surface of the turntable 2 and the inside of the vacuum chamber 1 thickly enough to need to be determined to be removed, the cleaning gas nozzle 35 is used to perform dry cleaning to clean the inside of the vacuum chamber 1. When the dry cleaning is performed, the cleaning gas nozzle 35 supplies a fluorine-based gas such as $ClF_3$ while the supply of the source gas, oxygen gas and hydrogen gas is stopped. Such a fluorine-based dry cleaning gas has an etching capability and can remove the oxide film, but simultaneously gives some damage to the turntable 2 made of quartz, the ceiling plate 11 and the chamber body 12 made of aluminum and the other parts in the vacuum chamber 1. This can extract metal particles from the parts, and cause metal contamination, which can affect the film deposition process after the dry cleaning. The film deposition apparatus and the method for reducing the metal contamination according to the present embodiment reduce the negative impact of the metal contamination. In the meantime, details of the film deposition apparatus and the method for reducing the metal contamination according to the present embodiment will be described later, and the other components of the film deposition apparatus are described below.

Referring again to FIGS. 4A and 4B, the low, flat ceiling surface 44 is in the separation region D1 (as well as in the separation region D2 although not illustrated in the drawings), and the ceiling surface 45, which is higher than the ceiling surface 44, is in the first region 48A and the second region 48B. Therefore, the volumes of the first region 48A and the second region 48B are larger than the volumes of the separation spaces H in the separation regions D1 and D2. The ceiling surface 44 increases in width along the rotation direction of the turntable 2 toward the outer edge of the vacuum chamber 1. Further, as described below, the vacuum chamber 1 according to this embodiment includes evacuation ports 61 and 62 for evacuating the first region 48A and the second region 48B, respectively. These allow the first region 48A and the second region 48B to be kept lower in pressure than the separation spaces H of the separation regions D1 and D2. In this case, the 3DMAS gas discharged from the reaction gas nozzle 31 in the first region 48A is prevented from reaching the second region 48B through the separation spaces H because of the high pressures of the separation spaces H of the separation regions D1 and D2. Further, $O_2$ gas discharged from the reaction gas nozzle 32 in the second region 48B is prevented from reaching the first region 48A through the separation spaces H because of the high pressures of the separation spaces H of the separation regions D1 and D2. Accordingly, both reaction gases are separated by the separation regions D1 and D2, and are hardly mixed in the gas phase inside the vacuum chamber 1.

The height h1 of the lower ceiling surfaces 44 measured from the upper surface of the turntable 2 (FIG. 4A) is determined so as to allow the pressures of the separation spaces H of the separation regions D1 and D2 to be higher than the pressures of the first region 48A and the second region 48B, although depending on the amounts of $N_2$ gas supplied from the separation gas nozzles 41 and 42. The height h1 is preferably set at 0.5 mm to 10 mm, for example, and more preferably as small as possible. However, in order to prevent the turntable 2 from colliding with the ceiling surfaces 44 because of its rotation deflection, the height h1 may be approximately 3.5 mm to 6.5 mm. Likewise, the height h2 (FIG. 4A) from the lower ends of the separation gas nozzles 41 and 42 housed in the corresponding groove parts 43 of the convex portions 4 to the upper surface of the turntable 2 may be 0.5 mm to 4 mm.

Figure 5A:
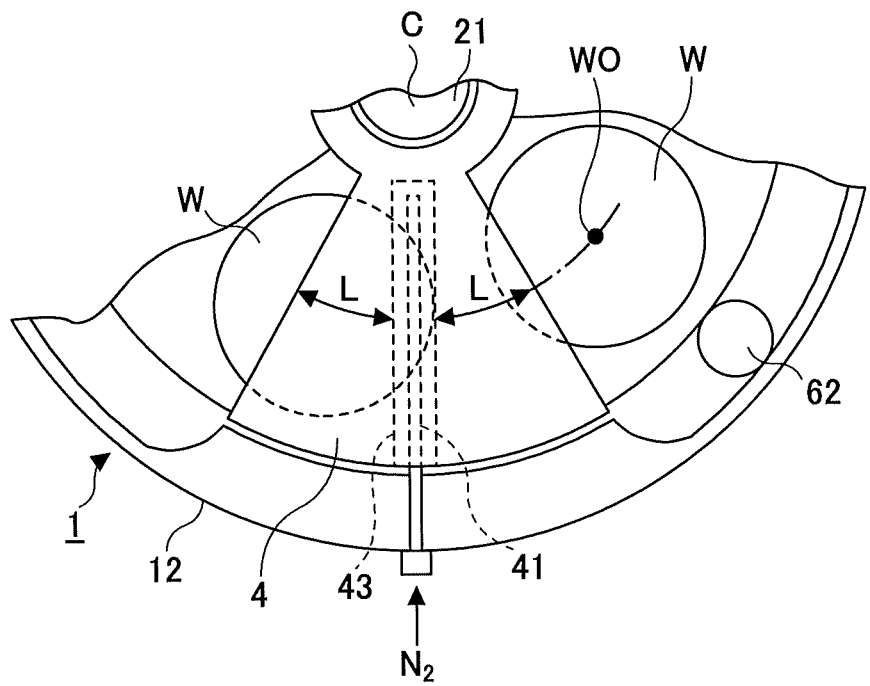
FIGS. 5A and 5B are diagrams for illustrating the size of the separation region according to the embodiment of the present disclosure.
Figure 5B:
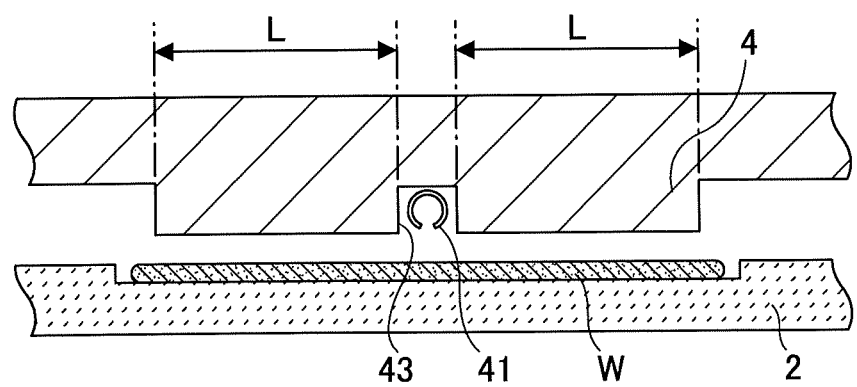

Further, as illustrated in FIGS. 5A and 5B, in each of the convex portions 4, for example, the length L of an arc corresponding to the path of a wafer center WO is preferably approximately 1/10 to approximately 1/1, more preferably more than or equal to approximately 1/6, of the diameter of the wafer W. This makes it possible to ensure that the separation spaces H of the separation regions D1 and D2 are kept high in pressure.

According to the separation regions D1 and D2 having the above-described configuration, it is possible to further ensure separation of 3DMAS gas and $O_2$ gas even if the turntable 2 rotates at, for example, a rotation speed of approximately 240 rpm.

Referring again to FIG. 1, FIG. 2, and FIG. 3, an annular convex protruding 5 is attached to the lower surface (ceiling surface) 45 of the ceiling plate 11 so as to surround the core part 21. The protruding portion 5 faces the turntable 2 in a region outside the core part 21. In this embodiment, as clearly illustrated in FIG. 7, the height h15 of a space (gap) 50 from the turntable 2 to the lower surface of the protruding portion 5 is slightly lower than the height h1 of the separation space H. This is because the rotation deflection of the turntable 2 is limited near its center part. Specifically, the height h15 may be approximately 1.0 mm to approximately 2.0 mm. In other embodiments, the height h15 may be equal to the height h1, and the protruding portion 5 and the convex portions 4 may be either formed as a unit or formed as a combination of separate bodies. FIG. 2 and FIG. 3 illustrate the inside of the vacuum chamber 1 from which the ceiling plate 11 is removed with the convex portions 4 left inside the vacuum chamber 1.

Figure 6:
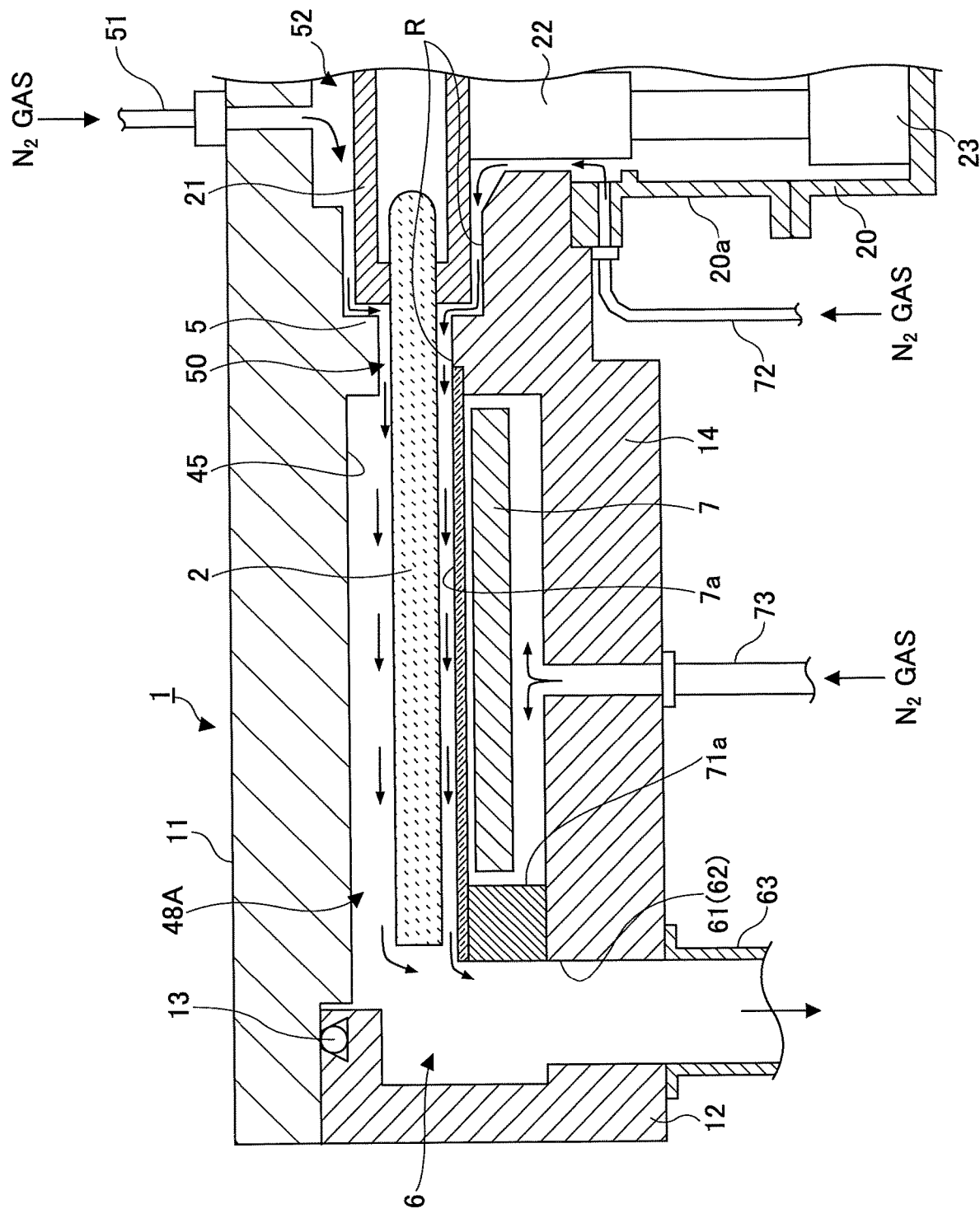
FIG. 6 is another cross-sectional view of the film deposition apparatus of FIG. 1 according to the embodiment of the present disclosure.

Referring to FIG. 6, which is an enlarged view of approximately half of FIG. 1, a separation gas supply pipe 51 is connected to the center part of the ceiling plate 11 of the vacuum chamber 1 so as to supply $N_2$ gas into a space 52 between the ceiling plate 11 and the core part 21. $N_2$ gas supplied into this space 52 allows the narrow gap 50 between the protruding portion 5 and the turntable 2 to be kept higher in pressure than the first region 48A and the second region 48B. This prevents 3DMAS gas discharged from the source gas nozzle 31 in the first region 48A from reaching the second region 48B through the high-pressure gap 50. Further, this prevents $O_2$ gas discharged from the oxygen gas nozzle 32 in the second region 48B from reaching the first region 48A through the high-pressure gap 50. Accordingly, both reaction gases are separated by the gap 50 and are hardly mixed in the gas phase inside the vacuum chamber 1. That is, in the film deposition apparatus of this embodiment, in order to separate 3DMAS gas and $O_2$ gas, a center region C is provided that is defined by the rotation center part of the turntable 2 and the vacuum chamber 1 and kept higher in pressure than the first region 48A and the second region 48B.

Figure 7:
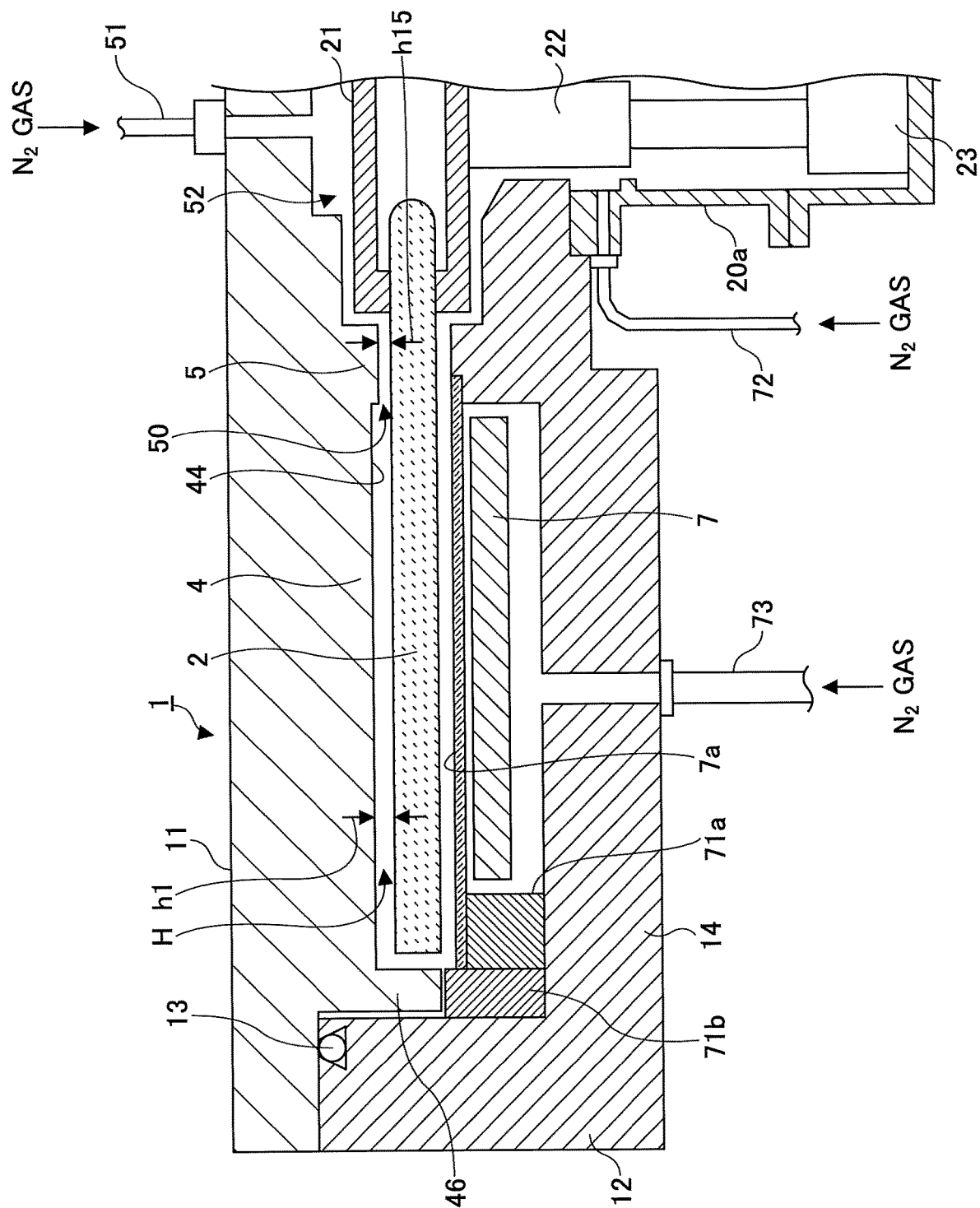
FIG. 7 is yet another cross-sectional view of the film deposition apparatus of FIG. 1 according to the embodiment of the present disclosure.

FIG. 7 illustrates approximately half of the cross-sectional view taken along line B-B of FIG. 3, where the convex portion 4 and the protruding portion 5 formed as a unit with the convex portion 4 are illustrated. As illustrated, the convex portion 4 has a bent portion 46 bent in an L-letter shape at its outer edge. The bent portion 46 substantially fills in a space between the turntable 2 and the chamber body 12 to prevent 3DMAS gas from the source gas nozzle 31 and $O_2$ gas from the reaction gas nozzle 32 from mixing through this gap. The gap between the bent portion 46 and the chamber body 12 and the gap between the bent portion 46 and the turntable 2 may be substantially equal to, for example, the height h1 from the turntable 2 to the ceiling surface 44 of the convex portion 4. Further, the presence of the bent portion 46 makes it difficult for $N_2$ gas from the separation gas nozzles 41 and 42 (FIG. 3) to flow toward outside the turntable 2. This helps $N_2$ gas to flow from the separation regions D1 and D2 to the first region 48A and the second region 48B. It is more preferable to provide a block member 71b below the bent portion 46 because this makes it possible to further control the separation gas flowing to a space below the turntable 2.

In view of the thermal expansion of the turntable 2, the gap between the bent portion 46 and the turntable 2 is preferably determined so that the gap becomes the above-described interval (approximately h1) when the turntable 2 is heated with a heater unit described below.

On the other hand, in the first region 48A and the second region 48B, the inner circumferential wall surface is depressed outward to form evacuation areas 6 as illustrated in FIG. 3. At the bottoms of these evacuation areas 6, for example, the evacuation ports 61 and 62 are provided as illustrated in FIG. 3 and FIG. 6. These evacuation ports 61 and 62 are connected to a vacuum evacuation unit such as a common vacuum pump 64 through respective evacuation pipes 63 as illustrated in FIG. 1. As a result, the first region 48A and the second region 48B are mainly evacuated, so that it is possible to cause the first region 48A and the second region 48B to be lower in pressure than the separation spaces H of the separation regions D1 and D2 as described above. Here, in FIG. 3, the depressed evacuation areas are provided, but the depressed structure is not necessary, and a variety of structures can be taken as long as the bottom part includes the evacuation ports 61 and 62.

Further, referring to FIG. 3, the evacuation port 61 corresponding to the first region 48A is positioned below the reaction gas nozzle 31 outside the turntable 2 (in the evacuation area 6). This allows 3DMAS gas discharged from the discharge holes 34 (FIGS. 4A and 4B) of the source gas nozzle 31 to flow toward the evacuation port 61 in a lengthwise direction of the source gas nozzle 31 along the upper surface of the turntable 2.

Referring again to FIG. 1, the evacuation pipes 63 are provided with a pressure controller 65, which controls the pressure inside the vacuum chamber 1. Alternatively, the evacuation ports 61 and 62 may be provided with corresponding pressure controllers 65. Further, the evacuation ports 61 and 62 may also be provided in the circumferential wall part of the chamber body 12 of the vacuum chamber 1 in place of the bottoms of the evacuation areas 6 (the bottom part 14 of the chamber body 12). Alternatively, the evacuation ports 61 and 62 may also be provided in the ceiling plate 11 in the evacuation areas 6. In the case of providing the evacuation ports 61 and 62 in the ceiling plate 11, however, particles in the vacuum chamber 1 may be thrown upward to contaminate the wafers W because the gas inside the vacuum chamber 1 flows upward. Therefore, it is preferable to provide the evacuation ports 61 and 62 at the bottom as illustrated or in the circumferential wall part of the chamber body 12. Further, providing the evacuation ports 61 and 62 at the bottom allows the evacuation pipes 63, the pressure controller 65, and the vacuum pump 64 to be installed below the vacuum chamber 1, and is therefore advantageous in reducing the footprint of the film deposition apparatus.

As illustrated in FIG. 1 and FIGS. 6 through 8, an annular heater unit 7 serving as a heating part is provided in a space between the turntable 2 and the bottom part 14 of the chamber body 12, so that the wafers W on the turntable 2 are heated to a predetermined temperature via the turntable 2. Further, a block member 71a is provided below the turntable 2 near its periphery so as to surround the heater unit 7. Therefore, the space where the heater unit 7 is placed is separated from a region outside the heater unit 7. In order to prevent gas from flowing inside the block member 71a, the block member 71a is placed so as to maintain a slight gap between the upper surface of the block member 71a and the lower (bottom) surface of the turntable 2. Multiple purge gas supply pipes 73 are connected at predetermined angular intervals to the region where the heater unit 7 is housed through the bottom part 14 of the chamber body 12 in order to purge this region. Above the heater unit 7, a protection plate 7a that protects the heater unit 7 is supported by the block member 71a and a raised portion R described below. This makes it possible to protect the heater unit 7 even if BTBAS gas or $O_3$ gas flows into the space where the heater unit 7 is provided. Preferably, the protection plate 7a is made of, for example, quartz.

Referring to FIG. 6, the bottom part 14 has the raised portion R inside the annular heater unit 7. The upper surface of the raised portion R is close to the turntable 2 and the core part 21 so as to have a slight gap left between the upper surface of the raised portion R and the lower surface of the turntable 2 and between the upper surface of the raised portion R and the bottom surface of the core part 21. Further, the bottom part 14 has a center hole through which the rotary shaft 22 passes. The inside diameter of this center hole is slightly larger than the diameter of the rotary shaft 22 to leave a gap communicating with the case body 20 through the flange part 20a. A purge gas supply pipe 72 is connected to the upper portion of the flange part 20a.

According to this configuration, as illustrated in FIG. 6, $N_2$ gas flows from the purge gas supply pipe 72 to the space below the turntable 2 through the gap between the rotary shaft 22 and the center hole of the bottom part 14, the gap between the core part 21 and the raised portion R of the bottom part 14, and the gap between the raised portion R of the bottom part 14 and the lower surface of the turntable 2. Further, $N_2$ gas flows from the purge gas supply pipes 73 to the space below the heater unit 7. These $N_2$ gases flow into the evacuation port 61 through the gap between the block member 71a and the lower surface of the turntable 2. The $N_2$ gases thus flowing serve as separation gases that prevent the reaction gas of BTBAS gas ($O_3$ gas) from circulating through the space below the turntable 2 to mix with $O_3$ gas (3DMAS gas).

Figure 8:
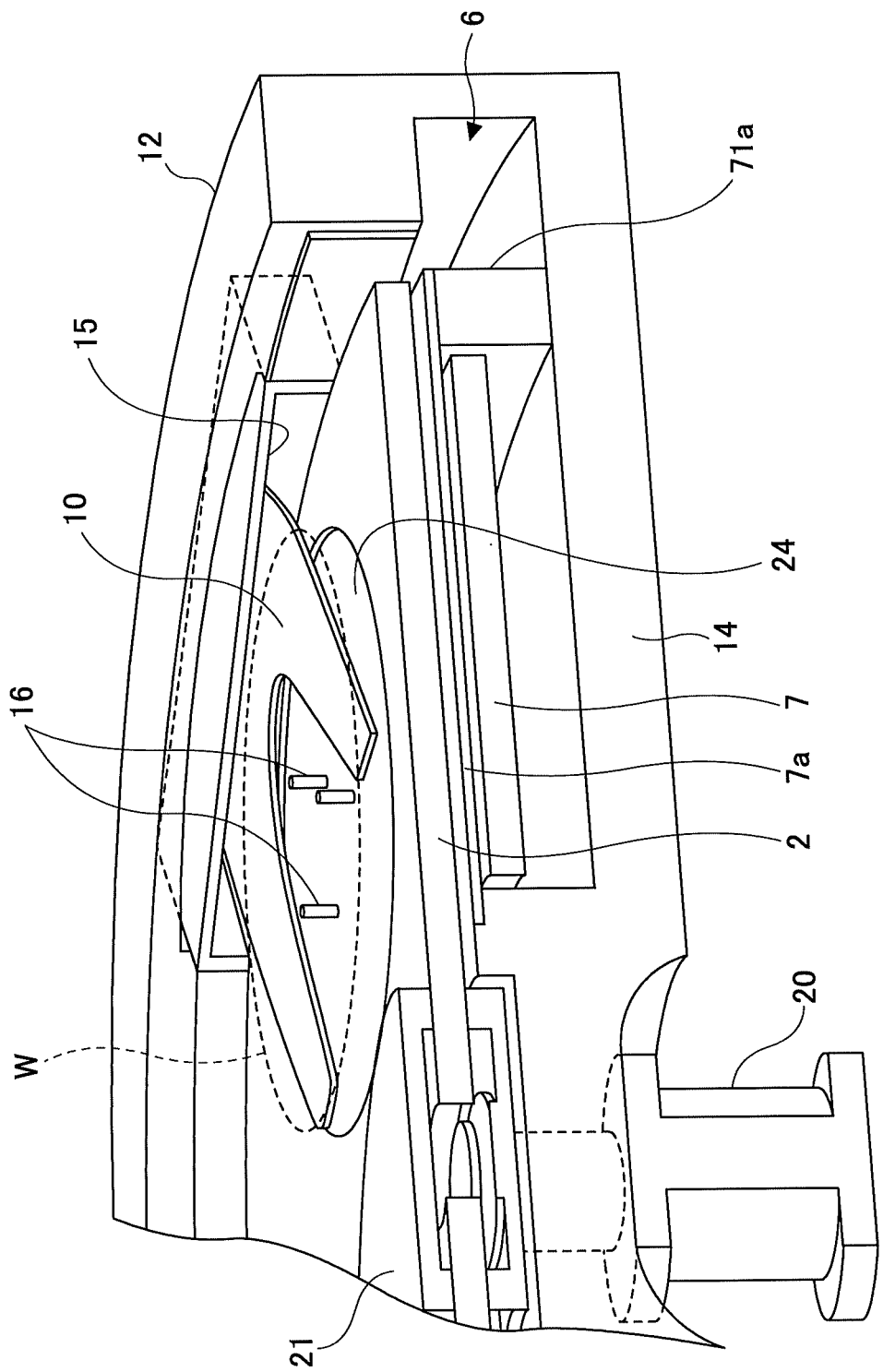
FIG. 8 is a cutaway perspective view of part of the film deposition apparatus of FIG. 1 according to the embodiment of the present disclosure.

Referring to FIG. 2, FIG. 3, and FIG. 8, a transfer opening 15 is formed in the circumferential wall part of the chamber body 12. The wafers W are transferred into or out of the vacuum chamber 1 by a transfer arm 10 through the transfer opening 15. The transfer opening 15 is provided with a gate valve (not illustrated), which causes the transfer opening 15 to be opened or closed. Further, three through holes (not illustrated) are formed at the bottom of each placement part 24, through which three lift pins 16 (FIG. 8) are vertically movable. The lift pins 16 support the bottom surface of the wafer W to move up or down the wafer W, and transfer the wafer W to or receive the wafer W from the transfer arm 10.

The film deposition apparatus according to this embodiment includes a controller 100 for controlling the operation of the entire apparatus as illustrated in FIG. 3. For example, this controller 100 includes a process controller 100a formed of a computer, a user interface part 100b, and a memory unit 100c. The user interface part 100b includes a display configured to display the operating state of the film deposition apparatus and a keyboard or a touchscreen panel for allowing an operator of the film deposition apparatus to select a process recipe or allowing a process manager to change parameters of process recipes (not illustrated).

The controller 100 also performs control for performing a method for reducing metal contamination described below. Details in this regard will be described below.

The memory unit 100c stores control programs for causing the process controller 100a to execute various processes, process recipes, and parameters in various processes. Further, some of these programs include a group of steps for causing, for example, a below-described cleaning method to be executed. These control programs and process recipes are read and executed by the process controller 100a in accordance with instructions from the user interface part 100b. Further, these programs may be contained in computer-readable storage media 100d and installed in the memory unit 100c through input/output devices (not graphically illustrated) supporting these storage media 100d. Examples of the computer-readable recording media 100d include a hard disk, a CD, a CD-R/RW, a DVD-R/RW, a flexible disk, and a semiconductor memory. Further, the programs may be downloaded into the memory unit 100c via a communication line.

[Method for Reducing Metal Contamination]

Next, a method for reducing metal contamination performed after dry-cleaning a film deposition apparatus and before starting the next film deposition process according to an embodiment of the present disclosure, is described below. The method for reducing the metal contamination according to the present embodiment is preferably used when a temperature during film deposition is higher than a temperature during the dry cleaning. Hence, an example of having the temperature during the film deposition higher than the temperature during the dry cleaning is described below in the present embodiment. More specifically, an example of having a temperature of 620 to 680° C. in dry cleaning and a temperature of 760° C. or higher is described below.

Figure 9:
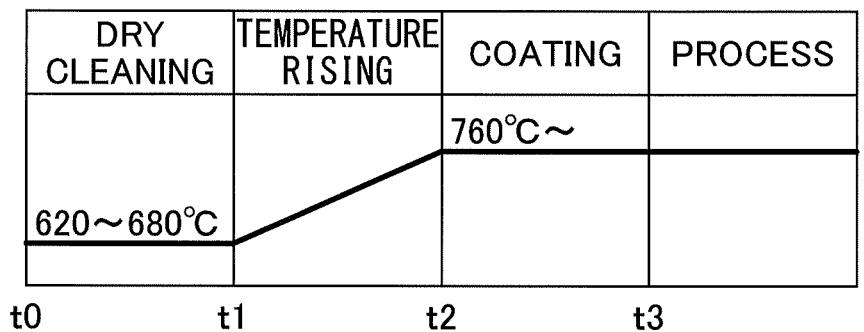
FIG. 9 is a diagram illustrating a sequence after conventional dry cleaning.

To begin with, a conventional sequence after dry cleaning is described with reference to FIG. 9. FIG. 9 is a diagram illustrating the conventional sequence after the dry cleaning.

In FIG. 9, the dry cleaning starts at time t0. As discussed above, the dry cleaning is performed by supplying a fluorine-based dry cleaning gas such as $ClF_3$ into the vacuum chamber 1 from the cleaning nozzle 35. On this occasion, the dry cleaning is performed while the temperature in the dry cleaning is maintained in a range from 620 to 680° C. because an etching effect is higher as the temperature is higher and because the dry cleaning at 760° C. that is the temperature during the film deposition damages parts in the vacuum chamber 1. Such a temperature range is set at a temperature that can remove an oxide film by dry cleaning but can minimize the damage to the parts. However, some damage to the parts in the vacuum chamber 1 occurs, and thereby the parts discharge particles of a metal substance outside, which causes metal contamination.

After the dry cleaning is performed from time t0 to time t1, the temperature is increased to 760° C. that is the temperature during the film deposition.

In a period from time t2 to time t3, a coating is performed. The coating is performed without a wafer W in the vacuum chamber 1, that is, without a wafer placed on the turntable 2, by supplying a source gas from the source gas nozzle 31, supplying oxygen gas from the oxygen gas nozzle 32 and supplying hydrogen gas from the hydrogen gas nozzle 33 under conditions the same as the normal film deposition. Thus, an oxide film is deposited on the inner surface and inner parts of the vacuum chamber 1 including the surface of the turntable 2. Such a coating is performed to cap a metal contamination substance by the film deposition and to generate no contamination.

From time t3, a wafer W is carried into the vacuum chamber 1 and a film deposition process is performed. However, when the metal contamination is checked when the process starts after the coating, it is frequently determined that a level of the metal contamination is high and that the film deposition process cannot be performed as it is. When it is determined that the film deposition cannot be performed, the coating is performed again, but a throughput decreases when such a recovery time is spent.

Figure 10:
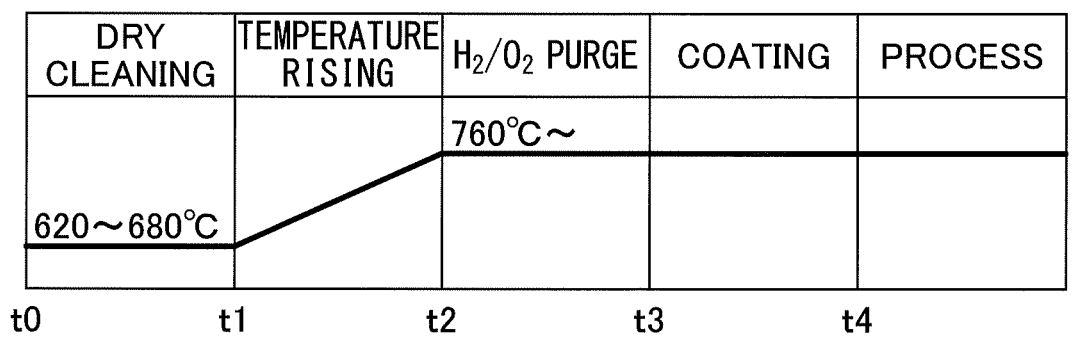
FIG. 10 is a sequence diagram illustrating an example of a method for reducing metal contamination according to an embodiment of the present disclosure.

FIG. 10 is a sequence diagram illustrating an example of a method for reducing metal contamination according to a first embodiment of the present disclosure.

In FIG. 10, during a period from time t0 to time t1, dry cleaning is performed. As described above, the dry cleaning is performed by supplying a fluorine-based dry cleaning gas such as $ClF_3$ from the cleaning gas nozzle 35 illustrated in FIGS. 2 and 3 into the vacuum chamber 1. The dry cleaning temperature is set at a predetermined temperature in a range from 600 to 690° C., for example, preferably in a range from 620 to 680° C.

During a period from time t1 to time t2, a temperature rising process is performed. In the temperature rising process, the temperature in the vacuum chamber is raised by using the heater unit 7. As illustrated in FIGS. 1 and 6 through 8, the heater unit 7 is provided under the turntable 2, and its temperature is set based on the temperature of a wafer W, but the temperature inside the vacuum chamber naturally rises together with the temperature of the wafer W. When the temperature during the film deposition is set at 760° C., the temperature inside the vacuum chamber 1 is raised to 760° C.

During a period from time t2 to time t3, an $H_2/O_2$ purge process is performed. In the $H_2/O_2$ purge process, hydrogen radicals and oxygen radicals are supplied into the vacuum chamber 1. Hence, the $H_2/O_2$ purge process may be referred to as an $H_2/O_2$ radical supply process. Hydrogen radicals and oxygen radicals are generated by supplying hydrogen gas and oxygen gas from the hydrogen gas nozzle 33 and the oxygen gas nozzle 32, respectively. Because the temperature inside the vacuum chamber 1 is 760° C., which is a very high temperature, when hydrogen gas and oxygen gas are supplied into the vacuum chamber 1, hydrogen gas and oxygen gas decompose by the heat and become radicals, which are hydrogen radicals and oxygen radicals.

FIG. 11 is a diagram showing a combustion reaction of hydrogen. In the process of reaction between $H_2$ and $O_2$, a variety of reactions occurs and a hydrogen radical H* is generated. Such a H* radical serves as a reductant. Moreover, an oxygen radical O* serves as an oxidant. By supplying such a reductant and an oxidant, a metal element that cannot be inhibited only by coating can be extract from parts in the vacuum chamber 1 by a reduction reaction and an oxidation reaction. In other words, not only metal particles present on the parts but also metal particles present slightly inside the surface and released from the parts can be extracted and removed by the reduction reaction and the oxidation reaction. Although such a reduction reaction and an oxidation reaction does not work efficiently to all metal elements, because the vacuum chamber 1 contains many kinds of metal element particles, which is considered to contain a metal element to which the reduction reaction or the oxidation reaction efficiently works.

Supplying the reductant and oxidant during the period from time t2 to time t3 efficiently acts on the metal element to which the supply of the reductant and oxidant is efficient, and contributes to the reduction of the metal contamination. Metal elements include a type of metal elements to which the coating efficiently work and a type of metal elements to which the supply of the oxidant and reductant efficiently work depending on a kind of the metal elements. The present process efficiently acts on the metal element to which the supply of the oxidant and reductant is efficient.

FIG. 10 is described again. During a period from time t3 to time t4, a coating process is performed. As described above, the coating is performed by supplying a source gas from a source gas nozzle 31 and supplying oxygen gas from an oxygen gas nozzle 32 under the same conditions as the normal film deposition conditions without a wafer W in the vacuum chamber 1, that is, without placing any wafer W on the turntable 2. Thus, an oxide film is deposited in the vacuum chamber 1 including the turntable 2, and surfaces of the vacuum chamber 1 and the parts inside the vacuum chamber 1 are capped with the oxide film, thereby playing a role of reducing the metal contamination. The coating covering the surface with the oxide film works better than the reduction reaction and the oxidation reaction for at least one metal element among a plurality kinds of metal elements to reduce the metal contamination. The coating process efficiently acts on such a metal element.

After completing the coating process, a normal film deposition process starts from time t4. Because the vacuum chamber 1 including the turntable 2 go through two different types of metal contamination reducing processes of the supply of $H_2/O_2$ radicals and the coating, the metal contamination can be reduced significantly more than the conventional method, and the film deposition process can be smoothly started.

Figure 12:
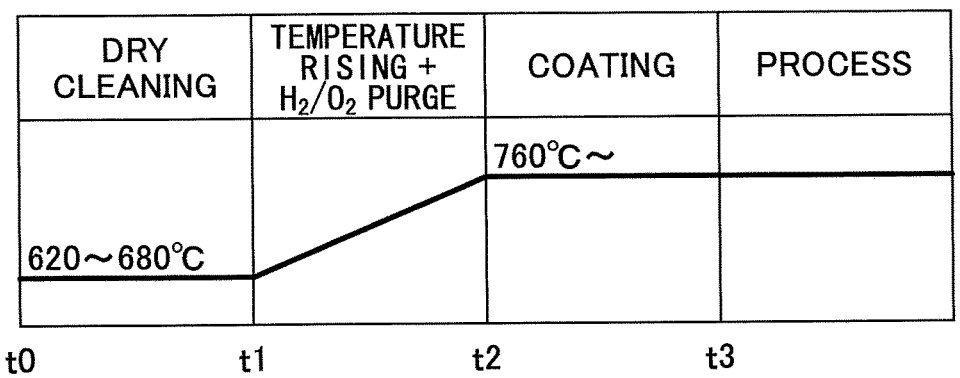
FIG. 12 is a diagram illustrating an example of a sequence of a method for reducing metal contamination according to an embodiment of the present disclosure.

FIG. 12 is a diagram illustrating an example of a sequence of a method for reducing metal contamination according to a second embodiment of the present disclosure. The sequence of the method for reducing the metal contamination according to the second embodiment differs from the sequence of the method for reducing the metal contamination according to the first embodiment in that the temperature rising process and the $H_2/O_2$ purge process are performed at the same time.

As illustrated in FIG. 12, the description of a dry cleaning process performed during a period from time t0 to time t1 is omitted because the dry cleaning process is the same as the dry cleaning process of the method for reducing the metal contamination according to the first embodiment.

During a period from time t1 to time t2, a temperature rising process and an $H_2/O_2$ purge process are performed at the same time. In other words, the temperature in the vacuum chamber 1 is increased from the temperature during the dry cleaning (e.g., 620 to 680° C.) to the film deposition temperature (e.g., 760° C.) while the hydrogen gas nozzle 33 and the oxygen gas nozzle 32 supply hydrogen gas and oxygen gas, respectively, into the vacuum chamber 1.

Because radicalization of hydrogen gas and oxygen gas gradually starts from 400° C. and gradually becomes active as the temperature reaches 600° C. or higher, and further 700° C. or higher, hydrogen radicals and oxygen radicals are generated by supplying hydrogen gas and oxygen gas into the vacuum chamber 1. Then, the hydrogen radicals and the oxygen radicals are continued to be supplied into the vacuum chamber 1 while the temperature in the vacuum chamber 1 is heated using the heater unit 7. As described in FIG. 11, H* that serves as a reductant and O* that serves as an oxidant cause the reduction reaction and the oxidation reaction, and metal particles of a predetermined metal element is extracted and removed from the parts inside the vacuum chamber 1. Because the temperature in the vacuum chamber 1 gradually increases from the temperature during the dry cleaning to the film deposition temperature (which equals to the coating temperature), the hydrogen radicals and the oxygen radicals increase and the action becomes more activated as time proceeds. Then, when the temperature reaches the film deposition temperature (e.g., 760° C.) at time t2, the $H_2/O_2$ purge process ends.

Thus, by performing the temperature rising process and the $H_2$ $O_2$ purge process simultaneously, the period for performing the $H_2/O_2$ purge process does not need to be solely provided, and the period from the end of the dry cleaning process to the start of the coating can be shortened. Although the $H_2/O_2$ purge process can enhance the effect of the metal contamination reduction as the $H_2/O_2$ purge process is performed longer, a sufficient effect can be obtained by performing the $H_2/O_2$ purge process for a certain period. Moreover, because the metal element to which the coating is more efficient than the reduction reaction and the oxidation reaction is definitely present, the effect of reducing the metal contamination can be sufficiently obtained even by the sequence of performing the $H_2/O_2$ purge process during the temperature rising process and switching the $H_2/O_2$ purge process to the coating process when the temperature reaches the film deposition temperature.

The coating process is performed during a period from time t2 to time t3, and the film deposition process starts from time t3. However, because the details of the film deposition process are the same as those of the method for reducing the metal contamination according to the first embodiment, the description is omitted.

The method for reducing the metal contamination according to the second embodiment can remove the period spent for only the $H_2/O_2$ process and can reduce the metal contamination while improving the throughput by performing the temperature rising process and the $H_2/O_2$ process at the same time.

Figure 13:
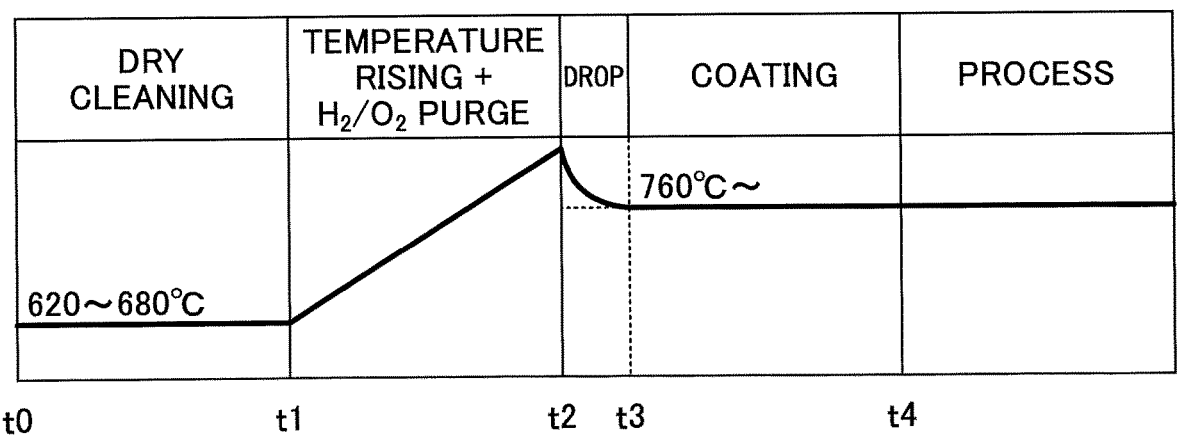
FIG. 13 is a diagram illustrating an example of a sequence of a method for reducing metal contamination according to an embodiment of the present disclosure.

FIG. 13 is a diagram illustrating an example of a method for reducing metal contamination according to a third embodiment of the present disclosure. The method for reducing the metal contamination according to the third embodiment is the same as the sequence of the method for reducing the metal contamination according to the second embodiment in that the temperature rising process and the $H_2/O_2$ process are performed at the same time, but differs from the sequence of the method for reducing the metal contamination according to the second embodiment in that a target temperature in the temperature rising process and the $H_2/O_2$ purge process is set at a predetermined temperature that is higher than the film deposition temperature (e.g., 760° C.) and then that the coating process is performed after the temperature is decreased to the film deposition temperature. The $H_2/O_2$ purge process is more efficient as the $H_2/O_2$ purge process is performed at a higher temperature. Hence, in the sequence of the method for reducing the metal contamination according to the third embodiment, the final reachable temperature during the $H_2/O_2$ purge process is set at a temperature that is higher than the film deposition temperature, thereby more efficiently removing the metal element by the reduction reaction and the oxidation reaction.

The sequence of the method for reducing the metal contamination according to the third embodiment is described below in more detail.

The description of a dry cleaning process performed during a period from time t0 to time t1 is omitted because the dry cleaning process is the same as the dry cleaning process of the method for reducing the metal contamination according to the first embodiment.

During a period from time t1 to time t2, the temperature rising process and the $H_2/O_2$ purge profess are performed at the same time. Although the procedure is the same as the procedure described in the second embodiment, the target temperature is set at a temperature that is higher than the film deposition temperature (e.g., 760° C.), and for example, is set at a predetermined temperature in a range of 765 to 800° C. Thus, more hydrogen radicals and oxygen radicals are generated, and more metal particles are evaporated and removed by activating the extraction of the metal element caused by the reduction reaction and the oxidation reaction, thereby obtaining much more effect of the metal contamination reduction.

During a period from time t2 to time t3, a temperature dropping process is performed. In the temperature dropping process, the state is held without doing anything until the temperature inside the vacuum chamber 1 reaches a predetermined film deposition temperature. Because the coating process is generally performed at a temperature as high as the film deposition temperature, the state is held without doing anything until the temperature inside the vacuum chamber 1 drops to the film deposition temperature.

During a period from time t3 to time t4, the coating process is performed, and the film deposition process is performed from time t4. Here, the details of the coating process and the film deposition process are the same as the coating process and the film deposition process of the first and second embodiments, the description is omitted.

In the above description, an example is described of waiting the temperature in the vacuum chamber 1 to drop to the film deposition temperature without starting the coating process. However, the coating process may be performed consecutively subsequent to the temperature rising process and the $H_2/O_2$ purge process during the period from time t2 to time t4 while performing the temperature dropping process. Because the coating at the temperature higher than the film deposition temperature does not affect the film deposition process, and sometimes the coating at a higher temperature is more efficient, the coating may be performed during the temperature dropping process at the same time.

The method for reducing the metal contamination according to the third embodiment can further enhance the effect of reducing the metal contamination by performing the $H_2/O_2$ process at a higher temperature so as to enhance the effect of the reduction reaction and the oxidation reaction.

Next, operation of the film deposition process performed after the coating process using the film deposition apparatus according to the present embodiment is described below. First, the turntable 2 rotates so that a placement part 24 is aligned with the transfer opening 15, and the gate valve (not illustrated) is opened. Next, a wafer W is transferred into the vacuum chamber 1 through the transfer opening 15 by the transfer arm 10. The wafer W is received by the lift pins 16, and after the transfer arm 10 is pulled out of the vacuum chamber 1, the wafer W is lowered to the placement part 24 by the lift pins 16, which are driven by an elevation mechanism (not graphically illustrated). The above-described series of operations is repeated five times, so that the five wafers W are placed on the corresponding placement parts 24.

Next, the pressure inside the vacuum chamber 1 is maintained at a preset value by the vacuum pump 64 and the pressure controller 65 (FIG. 1). The turntable 2 starts rotating clockwise as viewed from above. The turntable 2 is preheated to a predetermined temperature (for example, 760° C.) by the heater unit 7 at the coating, so that the wafers W placed on this turntable 2 are heated. After the controller 100 checks that the wafers W are heated and maintained at the predetermined temperature using a temperature sensor (not illustrated), 3DMAS gas is supplied to the first process region P1 through the reaction gas nozzle 31, and $O_2$ gas is supplied to the second process region P2 through the reaction gas nozzle 32. In addition, $N_2$ gas is supplied from the separation gas nozzles 41 and 42. Furthermore, $N_2$ gas is supplied from the central region C, that is, a space between the protruding portion 5 and the turntable 2, along the surface of the turntable 2. Moreover, the separation gas supply pipe 51 $N_2$ and the purge gas supply pipes 72 and 73 also supply $N_2$ gas.

When the wafers W pass through the first process region P1 below the reaction gas nozzle 31, 3DMAS molecules adsorb on the surfaces of the wafers W. When the wafers W pass through the second process region P2 below the reaction gas nozzle 32, $O_2$ molecules adsorb on the surfaces of the wafers W, so that the 3DMAS molecules are oxidized by $O_2$. Accordingly, when the turntable 2 rotates so that the wafers W pass through both the process region P1 and the process region P2 one time each, a single molecular layer (or two or more molecular layers) of silicon oxide is famed on the surfaces of the wafers W. Next, the wafers W pass through the regions P1 and P2 alternately multiple times, so that a silicon oxide film having a predetermined thickness is deposited on the surfaces of the wafers W. After the deposition of the silicon oxide film having a predetermined thickness, supplying 3DMAS gas and $O_2$ gas is stopped, supplying $N_2$ gas from the separation gas nozzles 41 and 42, the separation gas supply pipe 51, and the purge gas supply pipes 72 and 73 is stopped, and the rotation of the turntable 2 is stopped. Then, the wafers W are successively transferred out of the vacuum chamber 1 by the transfer arm 10 in the operation opposite to the operation of transferring them in, so that the film deposition process ends.

Such a film deposition process is repeated, and when the silicon oxide film having a predetermined film thickness or thicker is deposited on the inner wall of the vacuum chamber 1 and the parts in the vacuum chamber 1 including the turntable 2, dry cleaning is performed. In the dry cleaning, the temperature in the vacuum chamber 1 is set at a predetermined temperature for the dry cleaning (e.g., a predetermined temperature in a range of 620 to 680° C.). Then, the cleaning gas 35 supplies a cleaning gas composed of a fluorine-based gas such as $ClF_3$ without the wafer W in the vacuum chamber 1, and removes the silicon oxide film in the vacuum chamber 1.

After finishing the dry cleaning, the method for reducing the metal contamination according to the present embodiments illustrated in FIGS. 10 through 13 is performed, and then the film deposition process is performed again.

Figure 14:
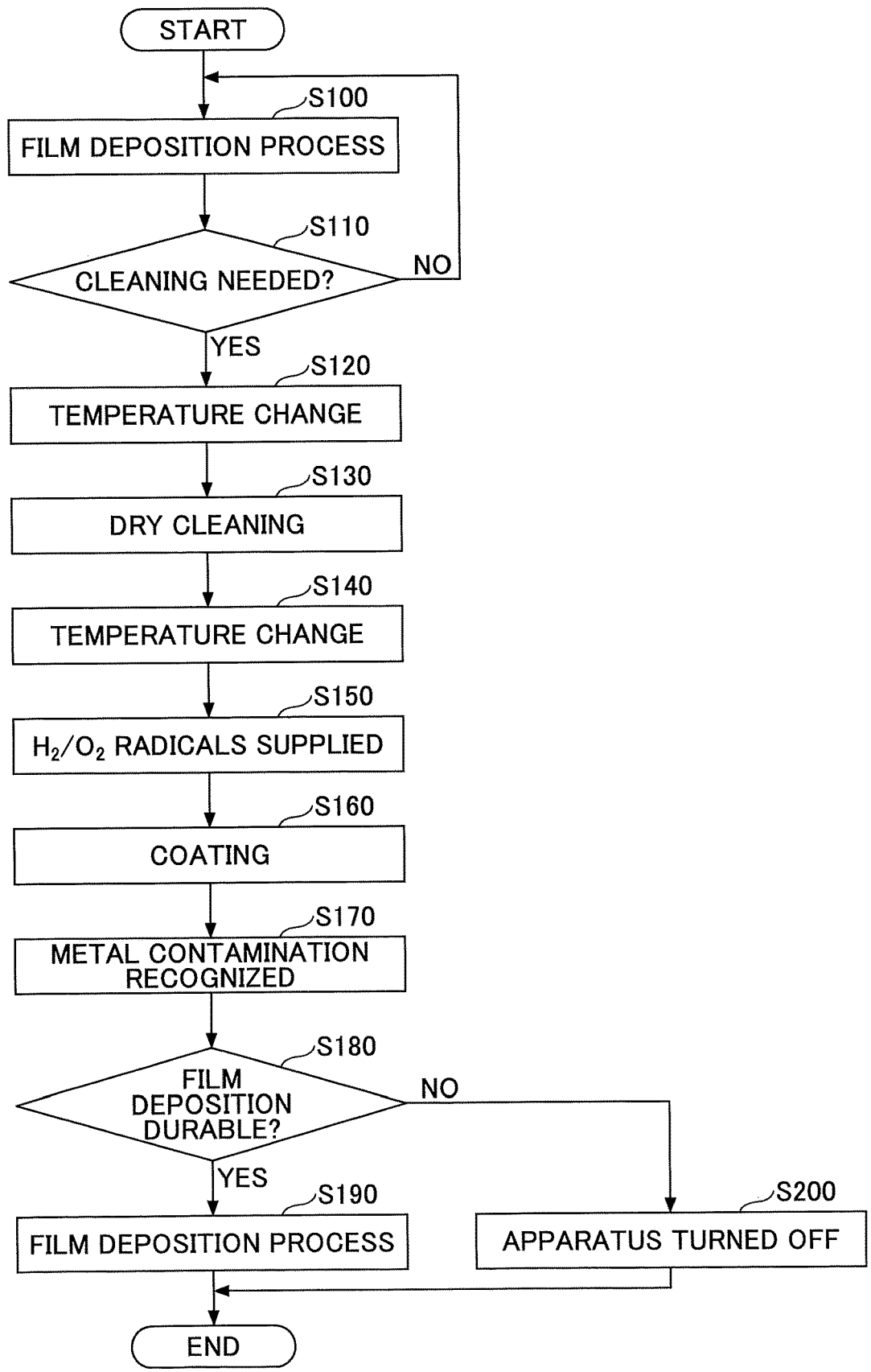
FIG. 14 is a diagram illustrating a process flow diagram for explaining a series of entire processes of a film deposition process and a cleaning process according to an embodiment of the present disclosure.

FIG. 14 is a process flow diagram for explaining a series of the entire processes.

In step S100, a film deposition process for usual mass production is performed. In the following process flow, an example of forming an oxide film is described. As the film deposition process is repeated, the oxide film is deposited on the surfaces of the turntable 2, the inner wall of the vacuum chamber 1 and a variety of parts in the vacuum chamber 1, and the film thickness of the oxide film increases.

In step S110, whether dry cleaning is necessary or not is determined. When the film thickness of the oxide film deposited on the vacuum chamber 1 is thick by repeating the film deposition process and the cleaning for removing the oxide film is determined to be needed, the process advances to step S120. In contrast, the cleaning for removing the oxide film is determined not to be needed yet, the process returns to step S100, and the film deposition process for mass production is continued.

In step S120, a first temperature changing process is performed to perform the dry cleaning. When the film deposition temperature is higher than the dry cleaning temperature, the first temperature changing process becomes a temperature dropping process. The description until now is about a case where the dry film deposition temperature is higher than the dry cleaning temperature, but the method for reducing the metal contamination according to the embodiment of the present disclosure can be applied to a case where the dry cleaning temperature is higher than the film deposition temperature. When the film deposition temperature is lower than the dry cleaning temperature, the first temperature chaining process becomes a temperature rising process. Here, the temperature change in the vacuum chamber 1 is performed by, for example, the heater unit 7. Although the heater unit 7 is arranged under the turntable 2 in the film deposition apparatus according to the present embodiment, the heater unit 7 may be arranged at another position inside the vacuum chamber 1 or outside the vacuum chamber 1. As long as the temperature in the vacuum chamber 1 can be changed, the configuration and the arrangement of a heating unit are not limited.

In step S130, the dry cleaning of the inside of the vacuum chamber 1 is performed. As discussed above, the cleaning gas nozzle 35 supplies a fluorine-based cleaning gas into the vacuum chamber 1 at a predetermined dry cleaning temperature, and the deposited oxide film is removed. At this time, the cleaning gas damages the parts in the vacuum chamber 1 to some degree, and the metal contamination occurs.

To reduce such damage, the dry cleaning temperature is set to a temperature as low as possible in a range capable of the dry cleaning. Hence, the first temperature changing process in step S120 often becomes the temperature dropping process.

In step S140, a second temperature changing process for changing the dry cleaning temperature to the film deposition temperature is performed. When the dry cleaning temperature is lower than the film deposition temperature, the second temperature changing process becomes a temperature rising process.

In step S150, an $H_2/O_2$ purge process is performed, and hydrogen radicals and oxygen radicals are supplied into the vacuum chamber 1. When the film deposition temperature is set at a high temperature that is higher than or equal to 600° C. or 700° C., by supplying hydrogen gas and oxygen gas into the vacuum chamber 1, the hydrogen radicals and the oxygen radicals are naturally generated due to heat. Here, the hydrogen gas nozzle 33 supplies hydrogen gas, and the oxygen gas nozzle 32 supplies oxygen gas.

Otherwise, the hydrogen radicals and the oxygen radicals may be generated by using a plasma generator. In this case, near the oxygen gas nozzle 32 and the hydrogen gas nozzle 33, for example, above the oxygen gas nozzle 32 and the hydrogen gas nozzle 33, a plasma generator that installs an antenna on the ceiling plate 11 of the vacuum chamber 1 may be provided, and inductively-coupled plasma may be generated by supplying radio frequency power to the antenna. As long as the hydrogen radicals and the oxygen radicals are supplied into the vacuum chamber 1, measures to generate the hydrogen radicals and the oxygen radicals are not limited.

By supplying the hydrogen radicals and the oxygen radicals into the vacuum chamber 1, a reduction reaction and an oxidation reaction occur in the vacuum chamber 1, metal particles at and around the surfaces of the parts in the vacuum chamber 1 are released by the reactions, and are evaporated and removed. Thus, the metal contamination can be reduced.

In step S160, a coating process is performed. In the coating process, a film deposition process is performed without the wafer in the vacuum chamber 1, and without placing the wafer W on the turntable 2. More specifically, the film deposition process is performed by supplying a source gas from the source gas nozzle 31 and supplying oxygen gas from the oxygen gas supply nozzle 32 while rotating the turntable 2 under the film deposition temperature. Here, oxygen gas supplied from the oxygen gas nozzle 32 may be $O_3$, $H_2O$ and the like other than $O_2$, and only has to be an oxygen-containing gas. However, in a high temperature process that is higher than or equal to 700° C., supplying oxygen gas is preferable.

In the coating process, the oxide film covers the parts in the vacuum chamber 1 and goes into a state of putting a lid of the oxide film on the parts. The metal particles present on the surfaces of the parts in the vacuum chamber 1 can be confined by the coating film, and the metal contamination can be inhibited.

In step S170, the metal contamination is checked. By using a predetermined metal contamination checking device, a degree of the metal contamination in the vacuum chamber 1 is checked.

In step S180, whether the film deposition process should be continued or not is determined depending on the degree of the metal contamination. When the film deposition process is determined to be able to continue, the flow goes to step S190. In step S190, the film deposition process for mass production is continued, and the present process flow ends. After that, the present process flow is repeated from step S100.

In contrast, when the film deposition process is not determined to be able to continue depending on the degree of the metal contamination, the process advances to step S200. In step S200, the film deposition apparatus is stopped, and the present process flow ends. After that, the method for reducing the metal contamination according to the present embodiment is repeated again, or measures to search the cause and the like are performed. However, by adopting the method for reducing the metal contamination according to the present embodiment, a situation of not being able to continue the film deposition process is considered to decrease dramatically. In view of this, step S200 is conserved a supplemental step.

Thus, the method for reducing the metal contamination, the film deposition method and the film deposition apparatus according to the present embodiments can promptly and efficiently reduce the metal contamination, and can improve productivity of the film deposition process.

The method for reducing the metal contamination, the film deposition method and the film deposition apparatus according to the present embodiment are not limited to the film deposition of the silicon oxide film, but can be applied to film deposition of other source gases such as another metal-containing gas. Moreover, because the oxygen gas nozzle 32 is provided, the application to the film deposition of an oxide film is efficient, but is applicable to the film deposition of a nitride film. When depositing a nitride film, by providing a gas supply nozzle for a nitride gas separately, the method for reducing the metal contamination, the film deposition method and the film deposition apparatus can be applied.

Thus, the method for reducing the metal contamination, the film deposition method and the film deposition apparatus can be applied to a variety of film deposition processes.

Working Examples

Next, working examples performing the method for reducing the metal contamination of the present embodiments are described below. Regarding conditions of the working examples, a source gas during film deposition was 3DMAS, and a pressure in the vacuum chamber 1 was set at 6.7 Torr. A rotational speed of the turntable 2 was set at 120 rpm. Flow rates of hydrogen gas and oxygen gas in the $H_2/O_2$ purge process were set at $H_2/O_2$=4000/6000 sccm, respectively. The $H_2/O_2$ purge process was performed for 120 minutes to check an effect of the metal contamination reduction. In the coating process, the temperature and the pressure in the vacuum chamber 1, and the rotational speed of the turntable 2 were maintained at the same conditions. The source gas of 3DMAS was supplied at a flow rate of 300 sccm, and $H_2/O_2$ were supplied at flow rates of 4000/6000 sccm. In the coating process, a silicon oxide film of 300 nm was deposited.

Figure 15:
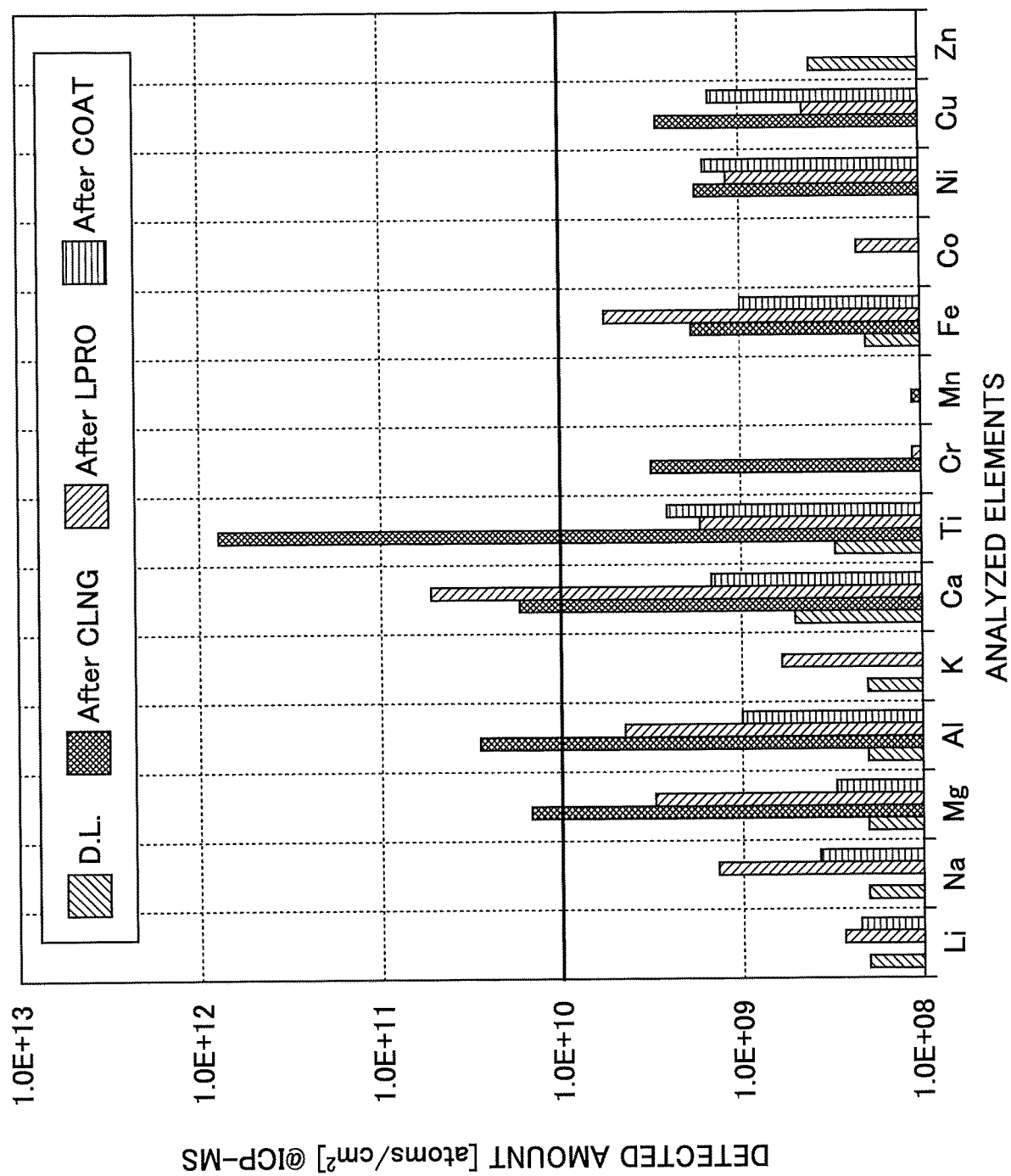
FIG. 15 is a diagram showing working results of working examples of the present disclosure by dividing the working results into types of metal elements.

FIG. 15 is a diagram showing results of the working examples of the present disclosure. In the present working examples, after performing the method for reducing the metal contamination under the above-mentioned conditions, the amount of metal contamination was measured after the cleaning process, the $H_2/O_2$ purge process, and the coating process, respectively. In FIG. 15, "D. L." indicates a lower detection limit of the metal elements, and "After CLNG" indicates measurement results after the cleaning process. Similarly, "After LPRO" indicates measurement results after the $H_2/O_2$ purge process, and "After COAT" indicates measurement results after the coating process. Moreover, the horizontal axis indicates metal elements, and the vertical axis indicates an amount of detection.

As illustrated in FIG. 15, at least 14 types of metal elements are acknowledged in the vacuum chamber 1. In FIG. 15, the measurement results after the cleaning process, the $H_2/O_2$ process, and the coating process are compared to each other, in most metal elements, high detection amounts can be read after the cleaning process, but the detection amounts widely decrease after the coating process. Furthermore, the detection amounts further decrease after the coating process, and the detection amount drastically decrease in total. In Ti, Ni, and Cu, the detection amounts after the $H_2/O_2$ purge process (after LPRO) are lower than the detection amounts after the coating process (after COAT), which means that the $H_2/O_2$ purge process more efficiently acts on Ti, Ni and Cu than the coating process. However, because the detection amounts do not necessarily increase widely after the coating process even in such metal elements, the results in FIG. 15 indicate that the method for reducing the metal contamination that performs the $H_2/O_2$ purge process first and then the coating process efficiently work for the contamination reduction of approximately all metal elements.

Figure 16:
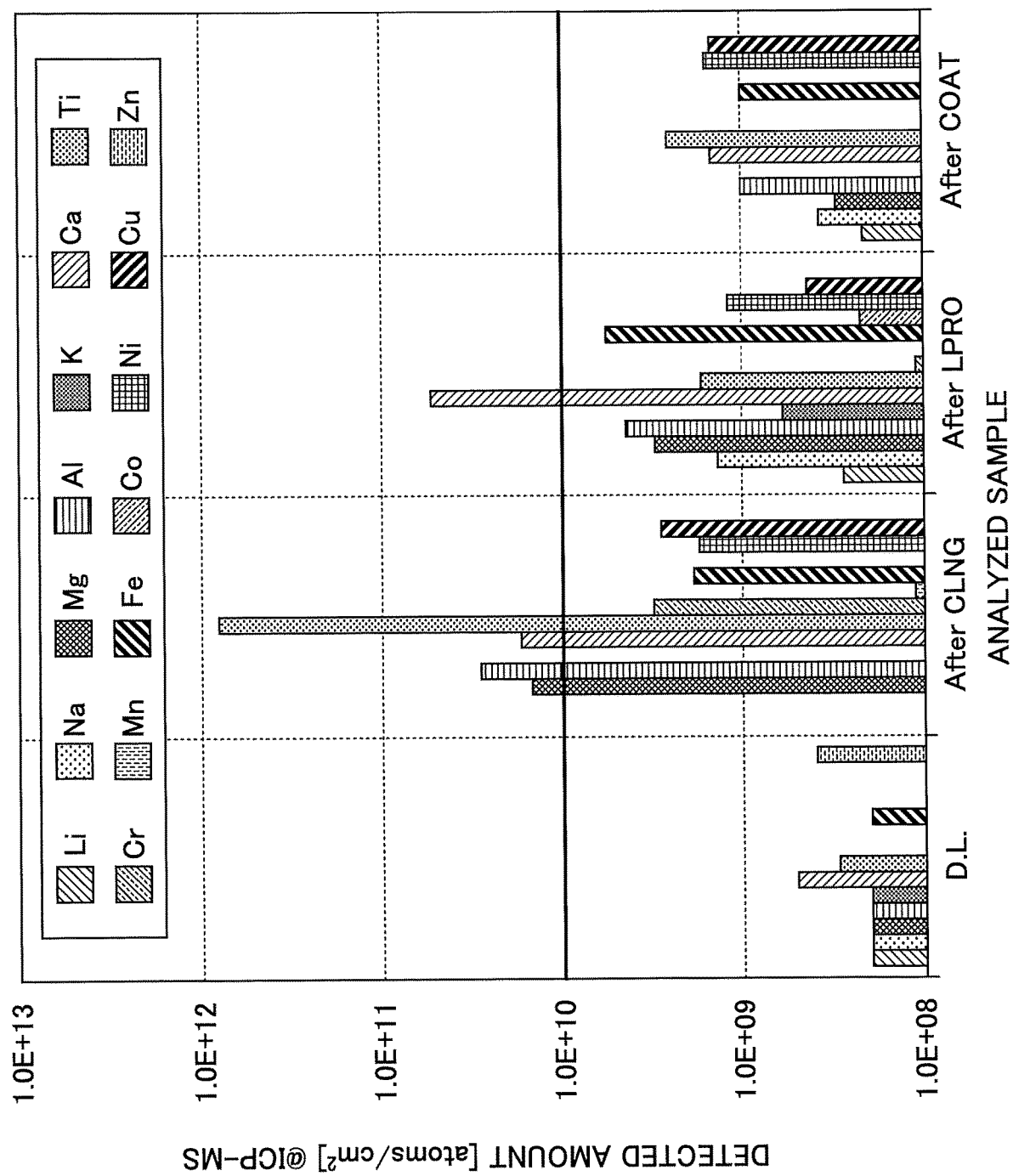
FIG. 16 is a diagram showing the results of the working examples by dividing the results into processes.

FIG. 16 is a diagram showing results of the working examples by dividing into the detection amounts after the cleaning process, the $H_2/O_2$ purge process, and the coating process. FIG. 16 indicates that the detection amounts sequentially decrease from ones after the coating process, to ones after the $H_2/O_2$ process, and ones after the coating process. Moreover, because a line drawn at "1.0E+10" shows a reference value to be below, FIG. 16 indicates that all of the metal elements are below the reference value after the coating process. Thus, the working examples indicate that the method for reducing the metal contamination according to the embodiment can reliably reduce the metal contamination.

As discussed above, the embodiments of the present disclosure can prevent metal contamination that occurs during dry cleaning from affecting a film deposition process.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A method for cleaning a process chamber containing a turntable that receives a plurality of substrates on a single top face along a circumferential direction, the method being performed between a first film deposition process and a second film deposition process, the method comprising steps of:
    dry cleaning an inside of the process chamber at a first temperature after the first film deposition process, thereby removing a previously deposited silicon oxide film inside the chamber deposited by the first film deposition process while causing metal particles contained in parts of the process chamber to be released therefrom;

stopping the dry cleaning of the process chamber;

increasing a substrate temperature in the process chamber after stopping the dry cleaning of the process chamber from the first temperature set during the dry cleaning of the process chamber to a film deposition temperature of 760 degrees C. or higher in the second film deposition process;

removing the metal particles, using activated hydrogen gas and activated oxygen gas, from the parts in the process chamber while supplying the hydrogen gas and the oxygen gas into the process chamber, the hydrogen gas and the oxygen gas being thermally activated at the film deposition temperature of 760 degrees C. or higher;

coating the parts including the turntable in the process chamber, before the second film deposition process, by depositing a silicon oxide coating film at the film deposition temperature of 760 degrees C. or higher in the second film deposition process, without a substrate in the process chamber after the removing the metal particles from the parts in the process chamber;

carrying a substrate into the process chamber;

performing the second film deposition process by depositing another silicon oxide film on the substrate at the film deposition temperature.

2. The method as claimed in claim 1, wherein the steps of increasing the temperature in the process chamber and activating hydrogen gas and oxygen gas in the process chamber are performed simultaneously.

3. The method as claimed in claim 1, wherein the first temperature during the dry cleaning is set at a temperature in a range from 600 to 690° C.

4. A method for reducing metal contamination performed for cleaning of a process chamber containing a turntable that receives a plurality of substrates on a single top face along a circumferential direction, the method being performed between a first film deposition process and a second film deposition process, the method comprising:

dry cleaning an inside of the process chamber at a first temperature after the first film deposition process, thereby removing a previously deposited silicon oxide film inside the chamber deposited by the first film deposition process while causing metal particles contained in parts of the process chamber to be released therefrom;

stopping the dry cleaning of the process chamber;

activating hydrogen and oxygen in the vacuum chamber while changing a temperature in the process chamber from the first temperature during the dry cleaning to a film deposition temperature of 760 degrees C. or higher in the film deposition process, thereby removing metal particles, using activated hydrogen gas and activated oxygen gas, from parts in the process chamber while supplying the hydrogen gas and the oxygen gas into the process chamber, the hydrogen gas and the oxygen gas being thermally activated at the film deposition temperature of 760 degrees C. or higher;

changing the temperature in the vacuum chamber to the film deposition temperature of 760 degrees C. or higher in the film deposition process;

coating the parts including the turntable in the process chamber by performing the film deposition process at the film deposition temperature of 760 degrees C. or higher without a substrate in the process chamber after the step of changing the temperature in the vacuum chamber for removing the metal particles from the parts in the process chamber;

carrying a substrate into the process chamber; and performing the second film deposition process by depositing another silicon oxide film on the substrate at the film deposition temperature.

5. The method as claimed in claim 4, wherein the first temperature during the dry cleaning is set at a temperature in a range from 600 to 690° C.

* * * * *